(12) United States Patent
Murata

(10) Patent No.: US 8,697,509 B2
(45) Date of Patent: Apr. 15, 2014

(54) SEMICONDUCTOR DEVICE HAVING INSULATING FILM WITH DIFFERENT STRESS LEVELS IN ADJACENT REGIONS AND MANUFACTURING METHOD THEREOF

(75) Inventor: Tatsunori Murata, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/558,970

(22) Filed: Jul. 26, 2012

(65) Prior Publication Data

US 2013/0032888 A1 Feb. 7, 2013

(30) Foreign Application Priority Data

Aug. 2, 2011 (JP) .................................. 2011-169046

(51) Int. Cl.
- *H01L 21/336* (2006.01)
- *H01L 21/8234* (2006.01)
- *H01L 21/44* (2006.01)

(52) U.S. Cl.
USPC ................... 438/197; 438/597; 257/E21.409; 257/E21.506; 257/E27.062

(58) Field of Classification Search
USPC ........... 438/197, 597; 257/E21.409, E21.506, 257/E27.062
See application file for complete search history.

(56) References Cited

U.S. PATENT DOCUMENTS

| 2010/0320512 A1* | 12/2010 | Idaka et al. ................. 257/288 |
| 2011/0037103 A1* | 2/2011 | Yamaguchi et al. .......... 257/255 |
| 2011/0260256 A1* | 10/2011 | Koide ............................ 257/368 |
| 2012/0199913 A1* | 8/2012 | Murata et al. ................ 257/369 |
| 2013/0119475 A1* | 5/2013 | Torii ............................. 257/368 |

FOREIGN PATENT DOCUMENTS

| JP | 2008-103504 A | 5/2008 |
| JP | 2008-147325 A | 6/2008 |

OTHER PUBLICATIONS

C.D.Sheraw et al., "Dual Stress Liner Enhancement in Hybrid Orientation Technology" *2005 Symposium on VLSI Technology Digest of Technical Papers*, pp. 12-13.

* cited by examiner

*Primary Examiner* — David S Blum
(74) *Attorney, Agent, or Firm* — Womble Carlyle

(57) ABSTRACT

An n-channel MISFETQn is formed in an nMIS first formation region of a semiconductor substrate and a p-channel MISFETQp is formed in an adjacent pMIS second formation region of the semiconductor substrate. A silicon nitride film having a tensile stress is formed to cover the n-channel MISFETQn and the p-channel MISFETQp. In one embodiment, the silicon nitride film in the nMIS formation region and the pMIS formation region is irradiated with ultraviolet rays. Thereafter, a mask layer is formed to cover the silicon nitride film in the nMIS formation region and to expose the silicon nitride film in the pMIS formation region. The silicon nitride film in the pMIS formation region is then subjected to plasma processing, which relieves the tensile stress of the silicon nitride film in the pMIS formation region.

22 Claims, 21 Drawing Sheets

A: SILICON NITRIDE FILM HAVING TENSILE STRESS
   (BEFORE HYDROGEN PLASMA PROCESSING)
B: SILICON NITRIDE FILM HAVING TENSILE STRESS
   (AFTER HYDROGEN PLASMA PROCESSING)
C: SILICON NITRIDE FILM HAVING COMPRESSIVE STRESS
   (BEFORE HYDROGEN PLASMA PROCESSING)
D: SILICON NITRIDE FILM HAVING COMPRESSIVE STRESS
   (AFTER HYDROGEN PLASMA PROCESSING)

SEMICONDUCTOR DEVICE HAVING INSULATING FILM WITH DIFFERENT STRESS LEVELS IN ADJACENT REGIONS AND MANUFACTURING METHOD THEREOF

CROSS-REFERENCE TO RELATED APPLICATIONS

The disclosure of Japanese Patent Application No. 2011-169046 filed on Aug. 2, 2011 including the specification, drawings and abstract is incorporated herein by reference in its entirety.

BACKGROUND

The present invention relates to semiconductor devices and manufacturing methods thereof, and more particularly, to a technique effectively applied to a semiconductor device including a MISFET and using a stress film, and a manufacturing method thereof.

Various measures have been currently taken to miniaturize transistors, thereby improving the performance of the transistors. However, the improvement of the performance of the transistor only by the miniaturization has a problem of an increase in cost as compared to the performance.

For this reason, a new method has been proposed to improve the performance of the transistor using a stress film, typified by a nitride film, in addition to the improvement of the performance of the transistor only by the miniaturization.

Japanese Unexamined Patent Publication No. 2009-111067 (Patent Document 1) discloses a technique that performs plasma processing on a stress distortion generating film formed over a semiconductor substrate.

Japanese Unexamined Patent Publication No. 2008-103504 (Patent Document 2) discloses a technique that involves forming a liner SiN film so as to cover a gate electrode, a source region, and a drain region, and applying ultraviolet rays to the liner SiN film.

Japanese Unexamined Patent Publication No. 2008-147325 (Patent Document 3) discloses a technique that involves forming a silicon nitride film and a silicon oxide film in that order to cover a gate structure of an NMON transistor and a gate structure of a PMOS transistor, and irradiating the silicon nitride film in an NMOS region with ultraviolet rays.

C. D. Sheraw et al., 2005 Symposium on VLSI Technology Digest of Technical Papers, p. 12-p. 13 (Non-Patent Document 1) discloses a technique regarding a dual stress liner which involves forming a silicon nitride film having a tensile stress so as to cover an n-channel MOSFET, and forming a silicon nitride film having a compressive stress so as to cover a p-channel MOSFET.

SUMMARY

The inventors have found the following facts through their studies.

When a tensile stress film is formed to cover the n-channel MISFET, a mobility of electrons in a channel region of the n-channel MISFET is increased or the like, which can increase an on-state current flowing through the channel of the n-channel MISFET, thus improving the performance of a semiconductor device including the n-channel MISFET. In contrast, when a compressive stress film is formed to cover the p-channel MISFET, a mobility of holes (positive holes) in a channel region of the p-channel MISFET is increased or the like, which can increase an on-state current flowing through the channel of the p-channel MISFET, thus improving the performance of a semiconductor device including the p-channel MISFET. The suitable stress film is a silicon nitride film.

When the tensile stress film and the compressive stress film are independently formed to cover the n-channel MISFET and the p-channel MISFET, respectively, the tensile stress film and the compressive stress film are partly superimposed on each other around a boundary between a region with the n-channel MISFET formed therein and a region with the p-channel MISFET formed therein. This would easily cause the peeling of the film or the generation of foreign matter, thus decreasing the manufacturing yield.

Thus, another method is proposed which involves forming a stress film common to the region with the n-channel MISFET formed therein and the region with the p-channel MISFET formed therein to thereby control the stress between the region with the n-channel MISFET and the region with the p-channel MISFET by the stress film. In this case, however, the stress useful for one of the n-channel MISFET and the p-channel MISFET is not useful for the other, which makes it difficult to improve the characteristics (performance) of both the n-channel MISFET and the p-channel MISFET. Hydrogen contained in the silicon nitride film as the stress film serves to increase NBTI (negative bias temperature instability) of the p-channel MISFET, which would reduce the performance of the semiconductor device with the CMISFET.

Accordingly, it is an object of the present invention to provide a technique that can improve the performance of the semiconductor device.

The above and other objects and the novel features of the invention will become apparent from the description of the present specification and the accompanying drawings.

The outline of representative aspects of the invention disclosed in the present application will be briefly described below.

A semiconductor device according to a representative embodiment of the invention includes a silicon nitride film formed as a stress film common to and covering an n-channel MISFET and a p-channel MISFET. A tensile stress of a part of the silicon nitride film covering the n-channel MISFET is at least twice as large as that of another part of the silicon nitride film covering the p-channel MISFET. A hydrogen content of the part of the silicon nitride film covering the n-channel MISFET is substantially equal to that of the part of the silicon nitride film covering the p-channel MISFET.

A manufacturing method of a semiconductor device according to another representative embodiment of the invention includes the steps of respectively forming an n-channel MISFET in a first region of a semiconductor substrate and a p-channel MISFET in a second region of the semiconductor substrate, and then forming a silicon nitride film having a tensile stress to cover the n-channel MISFET and the p-channel MISFET. The method also includes the steps of: irradiating the silicon nitride film in the first and second regions with ultraviolet rays, forming a mask layer covering the silicon nitride film in the first region and exposing the silicon nitride film in the second region, and performing plasma processing on the silicon nitride film in the second region in this state to thereby relieve the tensile stress of the silicon nitride film in the second region.

Effects of the representative aspects of the invention disclosed in the present application will be briefly described as follows.

The representative embodiments of the invention can improve the performance of the semiconductor device.

DETAILED DESCRIPTION

Figure 1:
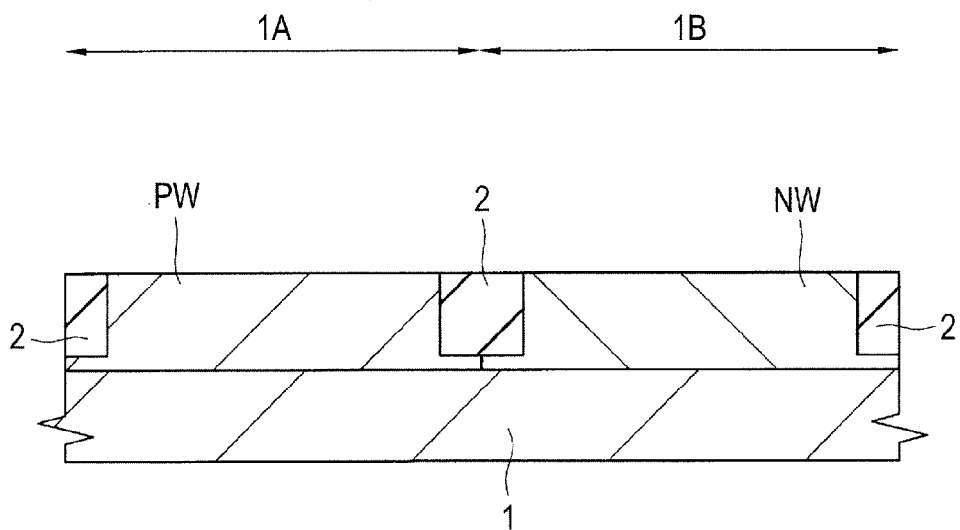
FIG. 1 is a cross-sectional view of a main part of a manufacturing step of a semiconductor device according to one embodiment of the invention.

The following preferred embodiments may be described below by being divided into a plurality of sections or embodiments for convenience, if necessary, which are not independent from each other except when specified otherwise. One of the sections or embodiments is a modified example, the details, a supplemental explanation, or the like of a part or all of the other. When reference is made to the number of elements or the like (including the number of pieces, numerical values, quantity, range, etc.) in the following embodiments, the number is not limited to a specific number, and may be greater than, or less than, or equal to the specific number, unless otherwise specified and definitely limited to the specific number in principle. It is also needless to say that components (including elements or process steps, etc.) employed in the following embodiments are not always essential, unless otherwise specified and considered to be definitely essential in principle. Similarly, when reference is made to the shapes, positional relations and the like of the components or the like in the following embodiments, they will include those substantially analogous or similar to their shapes or the like, unless otherwise specified and considered not to be definitely so in principle, etc. The same goes for the above-mentioned numerical value and range.

Preferred embodiments of the invention will be described below in detail based on the accompanying drawings. In all drawings for explanation of the embodiments, the member having the same function is designated by the same reference character, and thus a repeated description thereof will be omitted below. In the following embodiments, the description of the same or like parts is not repeated in principle if not necessary.

Among the drawings used for the embodiments, some cross-sectional views omit hatching for easy understanding. And, some plan views make hatching for easy understanding.

First Embodiment

As to Manufacturing Process of Semiconductor Device

Then, the manufacturing process of the semiconductor device of this embodiment will be described below with reference to the accompanying drawings. FIGS. 1 to 6 and FIGS. 8 to 15 are cross-sectional views of main parts of manufacturing steps of the semiconductor device in one embodiment of the invention, specifically, the main parts of the manufacturing steps of the semiconductor device with a complementary metal insulator semiconductor field effect transistor (CMISFET). FIG. 7 is a manufacturing process flowchart showing parts of the manufacturing process of the semiconductor device in the one embodiment of the invention. Specifically, FIG. 7 shows the manufacturing process flowchart from a step of forming the silicon nitride film 5 after obtaining the structure shown in FIG. 6 to a step of forming the interlayer insulating film 7.

First, as shown in FIG. 1, a semiconductor substrate (semiconductor wafer) 1 is prepared. Specifically, the semiconductor substrate has a specific resistance of, for example, about 1 to 10 Ωcm, and is made of p-type single crystal silicon. Then, an element isolation region 2 is formed over the main surface of the semiconductor substrate 1. The element isolation region 2 is formed of an insulator, such as silicon oxide, for example, by a shallow trench isolation (STI) method or a local oxidization of silicon (LOCOS) method. For example, an element isolation trench (trench for isolation of an element) is formed in the semiconductor substrate 1, and then an insulating film is embedded in the element isolation trench, so that the element isolation region 2 comprised of the insulating film embedded in the element isolation trench can be formed. The element isolation region 2 defines an nMIS formation region 1A and a pMIS formation region 1B. The nMIS formation region 1A is a region (active region) in which an n-channel metal insulator semiconductor field effect transistor (MISFET) Qn is formed. The pMIS formation region 1B is a region (active region) in which a p-channel MISFETQp is formed.

Then, in the nMIS formation region 1A, a p-type well (p-type semiconductor region) PW is formed by digging a part of the main surface of the semiconductor substrate 1 in a predetermined depth. In the pMIS formation region 1B, an n-type well (n-type semiconductor region) NW is formed by digging another part of the main surface of the semiconductor substrate 1 in a predetermined depth. The p-type well PW can be formed by ion-implanting p-type impurities, such as boron (B), into the semiconductor substrate 1 in the nMIS formation region 1A using a photoresist film (not shown) covering the pMIS formation region 1B as an ion implantation blocking mask. The n-type well NW can be formed by ion-implanting n-type impurities, such as phosphorus (P), into the semiconductor substrate 1 in the pMIS formation region 1B using another photoresist film (not shown) covering the nMIS formation region 1A as the ion implantation blocking mask. Either the p-type well PW or the n-type well NW may be formed in advance.

Figure 2:
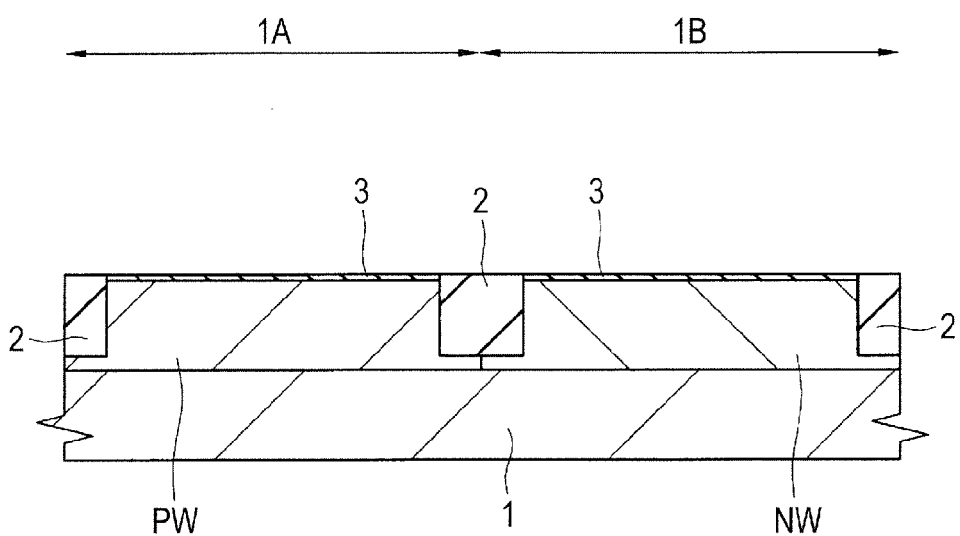
FIG. 2 is a cross-sectional view of a main part of another manufacturing step of the semiconductor device, following the step shown in FIG. 1.

Then, the surface of the semiconductor substrate 1 is cleansed (cleaned), for example, by wet etching using hydrofluoric acid (HF) aqueous solution. Thereafter, as shown in FIG. 2, an insulating film 3 for a gate insulating film is formed over the surface (main surface, specifically, the surfaces in the p-type well PW and the n-type well NW) of the semiconductor substrate 1 in the nMIS formation region 1A and the pMIS formation region 1B. The insulating film 3 becomes the gate insulating film for each of the n-channel MISFETQn and the p-channel MISFETQp to be described later. The insulating film 3 is comprised of, for example, a thin silicon oxide film, and thus can be formed, for example, by thermal oxidation.

Figure 3:
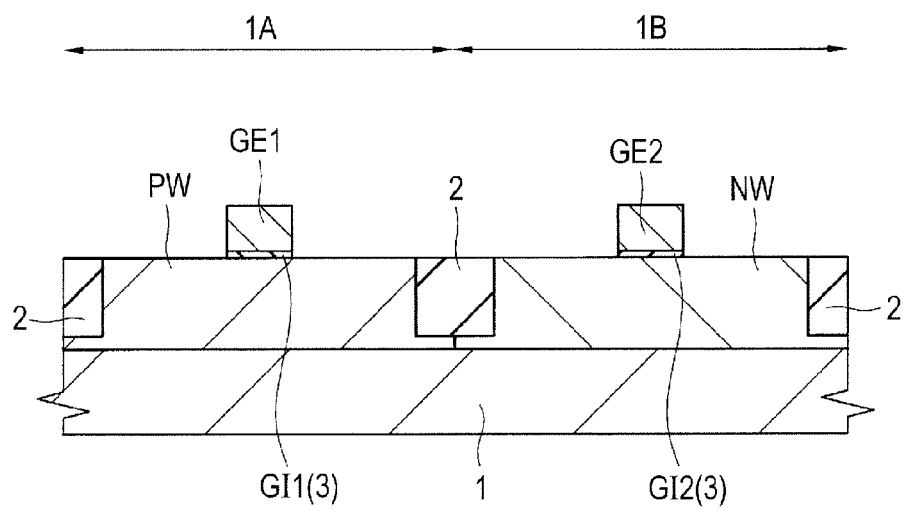
FIG. 3 is a cross-sectional view of a main part of another manufacturing step of the semiconductor device, following the step shown in FIG. 2.

Then, as shown in FIG. 3, gate electrodes GE1 and GE2 are formed. The gate electrodes GE1 and GE2 can be formed as follows. Specifically, a silicon film, such as a polycrystalline silicon film, is formed as a conductive film for formation of the gate electrode, in the entire main surface (that is, including the insulating film 3 in the nMIS formation region 1A and the pMIS formation region 1B) of the semiconductor substrate 1. Then, n-type impurities (such as phosphorus or arsenic) are ion-implanted into the silicon film in the nMIS formation region 1A, and p-type impurities (such as boron) are ion-implanted into the silicon film in the pMIS formation region 1B. Then, these silicon films are patterned by photolithography and dry etching, whereby the gate electrodes GE1 and GE2 can be formed. The silicon film may be comprised of an amorphous silicon film during deposition, but can be converted into a polycrystalline silicon film by heat treatment after the deposition (after the ion implantation).

The gate electrode GE1 serving as a gate electrode of the n-channel type MISFETQn is comprised of the polycrystalline silicon (n-type semiconductor film, or doped polysilicon film) into which n-type impurities are introduced, and thus formed over the p-type well PW in the nMIS formation region 1A via the insulating film 3. The insulating film 3 remaining under the gate electrode GE1 becomes a gate insulating film GI1 of the n-channel MISFETQn. That is, the gate electrode GE1 is formed over the insulating film 3 in the nMIS formation region 1A (that is, the gate insulating film GI1). The gate electrode GE2 serving as a gate electrode of the p-channel type MISFETQp is comprised of the polycrystalline silicon (p-type semiconductor film, or doped polysilicon film) into which p-type impurities are introduced, and thus formed over the n-type well NW in the pMIS formation region 1B via the insulating film 3. The insulating film 3 remaining under the gate electrode GE2 serves as a gate insulating film GI2 of the p-channel MISFETQp. That is, the gate electrode GE2 is formed over the insulating film 3 in the pMIS formation region 1B (that is, the gate insulating film GI2). In another embodiment, the gate electrodes GE1 and GE2 can be metal gate electrodes, and the gate insulating films GI1 and GI2 can be high-dielectric constant gate insulating films.

Figure 4:
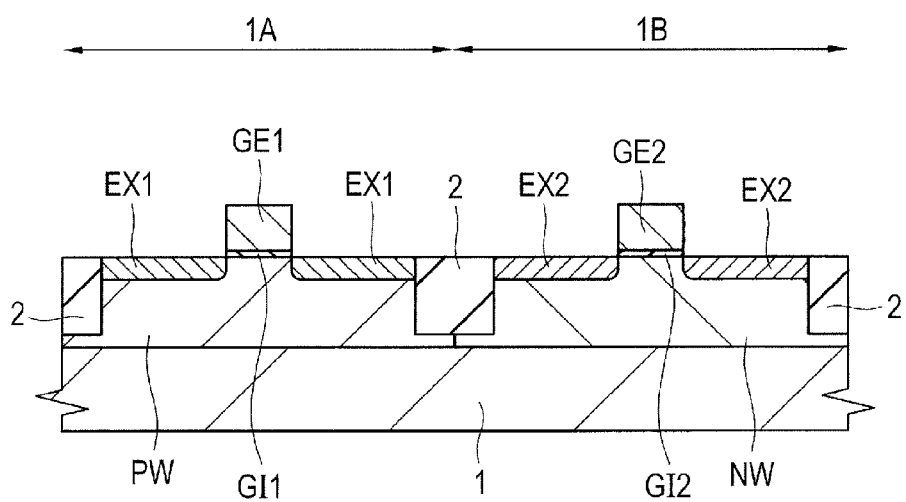
FIG. 4 is a cross-sectional view of a main part of another manufacturing step of the semiconductor device, following the step shown in FIG. 3.

Then, as shown in FIG. 4, the pMIS formation region 1B is covered with a photoresist pattern (not shown), and n-type impurities, such as phosphorus (P) or arsenic (As), are ion-implanted into both sides of the gate electrode GE1 over the semiconductor substrate 1 (p-type well PW) in the nMIS formation region 1A to thereby form (a pair of) n$^-$-type semiconductor regions (extension regions, source and drain extension regions) EX1. Upon performing the ion implantation for formation of the n$^-$-type semiconductor region EX1, the ion implantation is performed using the gate electrode GE1 over the semiconductor substrate 1 (p-type well PW) in the nMIS formation region 1A as a mask (ion implantation blocking mask). Thus, no ions are implanted into the region directly under the gate electrode GE1 in the p-type well PW because the ions are interrupted by the gate electrode GE1.

Then, p-type impurities, such as boron (B), are ion-implanted into both sides of the gate electrode GE2 over the semiconductor substrate 1 (n-type well NW) in the pMIS formation region 1B, while covering the nMIS formation region 1A with another photoresist pattern (not shown), so that (a pair of) p⁻-type semiconductor regions (extension regions, or source and drain extension regions) EX2 are formed. Upon performing the ion implantation for formation of the p⁻-type semiconductor region EX2, the ion implantation is performed using the gate electrode GE2 over the semiconductor substrate 1 (in the n-type well NW) in the pMIS formation region 1B as a mask (ion implantation blocking mask). Thus, no ions are implanted into the region directly under the gate electrode GE2 in the n-type well NW because the ions are interrupted by the gate electrode GE2. Either the n⁻-type semiconductor region EX1 or the p⁻-type semiconductor region EX2 may be formed in advance.

Figure 5:
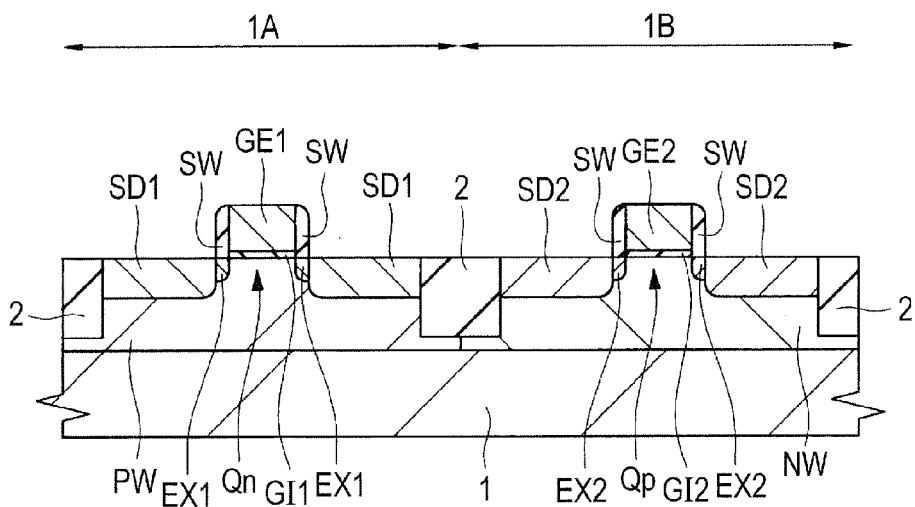
FIG. 5 is a cross-sectional view of a main part of another manufacturing step of the semiconductor device, following the step shown in FIG. 4.

Then, as shown in FIG. 5, a sidewall spacer (sidewall, sidewall spacer, sidewall insulating film) SW comprised of, for example, of a silicon oxide, a silicon nitride, or a laminated film of these insulating films is formed as a sidewall insulating film (insulating film) over the sidewall of each of the gate electrodes GE1 and GE2.

For example, the silicon oxide film, the silicon nitride film, or the laminated film thereof is deposited over the semiconductor substrate 1 so as to cover the gate electrodes GE1 and GE2, and subjected to anisotropic etching by a reactive ion etching (RIE) method or the like, so that the sidewall spacers SW can be formed. In this case, the sidewall spacer SW is comprised of the silicon oxide film, or the silicon nitride film, or a laminated film thereof remaining over each sidewall of the gate electrodes GE1 and GE2.

Then, n-type impurities, such as phosphorus (P) or arsenic (As), are ion-implanted into both sides of each of the gate electrode GE1 and the sidewall spacer SW over the semiconductor substrate 1 (p-type well PW) in the nMIS formation region 1A, while covering the pMIS formation region 1B with the photoresist pattern (not shown) to thereby form n⁺-type semiconductor regions SD1 (source and drain). Upon performing the ion implantation for formation of the n⁺-type semiconductor region SD1, the ion implantation is performed on the semiconductor substrate 1 (p-type well PW) in the nMIS formation region 1A using the gate electrode GE1 and the sidewall spacers SW on the sidewalls thereof as a mask (ion implantation blocking mask). No ions are implanted into the regions directly under the gate electrode GE1 and the sidewall spacers SW in the p-type well PW because of being interrupted by the gate electrode GE1 and the sidewall spacers SW. Thus, the n⁻-type semiconductor region EX1 is formed in alignment (self-alignment) with the gate electrode GE1, and the n⁺-type semiconductor region SD1 is formed in alignment (self-alignment) with the sidewall spacer SW over each sidewall of the gate electrode GE1.

Then, p-type impurities, such as boron (B), are ion-implanted into both sides of each of the gate electrode GE2 and the sidewall spacers SW over the semiconductor substrate 1 (in the n-type well NW) in the pMIS formation region 1B, while covering the nMIS formation region 1A with another photoresist pattern (not shown) to thereby form the p⁺-type semiconductor regions SD2 (source and drain). Upon performing the ion implantation for formation of the p⁺-type semiconductor region SD2, the ion implantation is performed on the semiconductor substrate 1 (n-type well NW) in the pMIS formation region 1B using the gate electrode GE2 and the sidewall spacers SW on the sidewalls thereof as a mask (ion implantation blocking mask). No ions are implanted into the regions directly under the gate electrode GE2 and the sidewall spacers SW in the n-type well NW because of being interrupted by the gate electrode GE2 and the sidewall spacers SW. Thus, the p⁻-type semiconductor region EX2 is formed in alignment (self-alignment) with the gate electrode GE2, and the p⁺-type semiconductor region SD2 is formed in alignment (self-alignment) with the sidewall spacer SW over each sidewall of the gate electrode GE2. Either the n⁺-type semiconductor region SD1 or the p⁺-type semiconductor region SD2 may be formed in advance.

After the ion implantation, an annealing process (activation annealing, or heat treatment) is performed to activate the introduced impurities. Thus, the impurities introduced into the n⁻-type semiconductor region EX1, the n⁺-type semiconductor region SD1, the p⁻-type semiconductor region EX2, and the p⁺-type semiconductor region SD2 can be activated In this way, an n-channel MISFET (metal insulator semiconductor field effect transistor) Qn is formed in the nMIS formation region 1A (p-type well PW thereof) as a field-effect transistor. A p-channel MISFET (metal insulator semiconductor field effect transistor) Qp is formed in the pMIS formation region 1B (n-type well NW thereof) as another field-effect transistor. Thus, the structure shown in FIG. 5 is obtained. The n-channel MISFETQn can be regarded as the n-channel field-effect transistor, and the p-channel MISFETQp can be regarded as the p-channel field-effect transistor.

The n⁺-type semiconductor region SD1 has a higher impurity concentration and a deeper junction depth than those of the n⁻-type semiconductor region EX1. Thus, the n-type semiconductor region (impurity diffusion layer) serving as a source or drain of the n-channel MISFETQn is formed of the n⁺-type semiconductor region SD1 and the n⁻-type semiconductor region EX1. Thus, the source and drain regions of the n-channel MISFETQn have a lightly doped drain (LDD) structure. The n⁺-type semiconductor region SD1 can be regarded as the semiconductor region (source/drain region) for the source or drain of the n-channel MISFETQn. The gate electrode GE1 serves as the gate electrode of the n-channel MISFETQn.

The p⁺-type semiconductor region SD2 has a higher impurity concentration and a deeper junction depth than those of the p⁻-type semiconductor region EX2. Thus, the p-type semiconductor region (impurity diffusion layer) serving as the source or drain of the p-channel MISFETQp is formed of the p⁺-type semiconductor region SD2 and the p⁻-type semiconductor region EX2. Thus, the source/drain region of the p-channel MISFETQp has the LDD structure. The p⁺-type semiconductor region SD2 can be regarded as the semiconductor region (source/drain region) for the source or drain of the p-channel MISFETQp. The gate electrode GE2 serves as a gate electrode of the p-channel MISFETQp.

Figure 6:
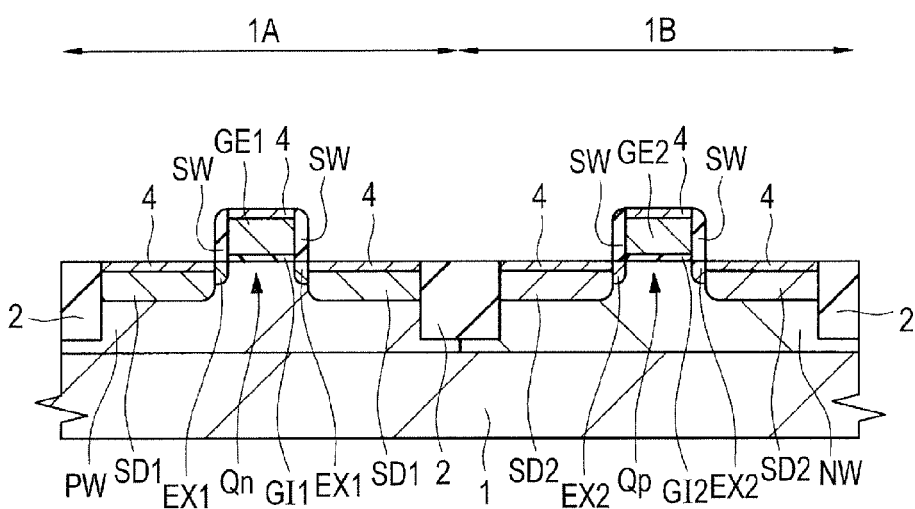
FIG. 6 is a cross-sectional view of a main part of another manufacturing step of the semiconductor device, following the step shown in FIG. 5.
Figure 7:
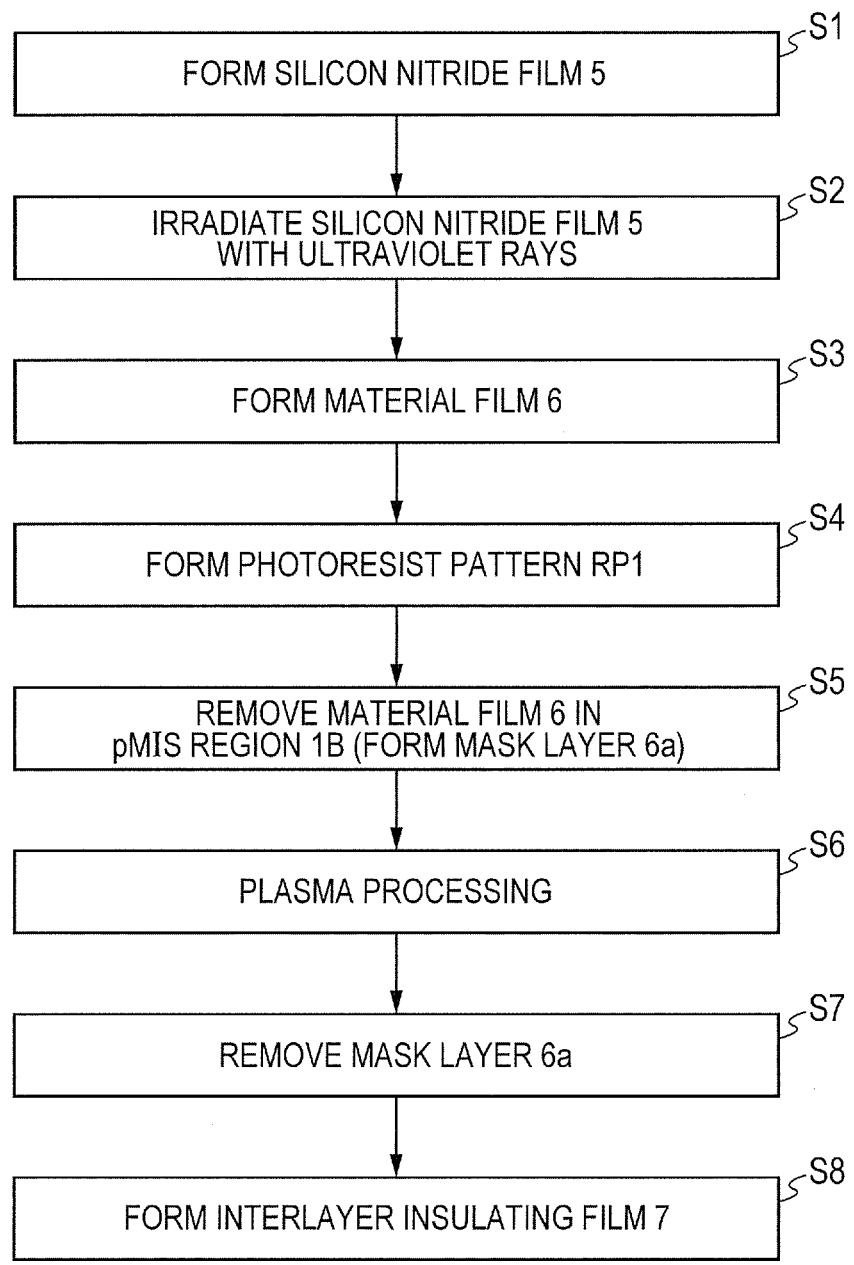
FIG. 7 is a manufacturing process flowchart showing some parts of a manufacturing process of the semiconductor device according to the one embodiment of the invention.

Then, as shown in FIG. 6, a metal silicide layer 4 having a low resistance is formed by self aligned silicide (salicide) technique over the surfaces (upper layer parts) of the gate electrode GE1 and the source and drain regions (n⁺-type semiconductor regions SD1) of the n-channel MISFETQn and also over the surfaces (upper layer parts) of the gate electrode GE2 and the source and drain regions (p⁺-type semiconductor region SD2) of the p-channel MISFETQp.

For example, the surfaces (upper surfaces) of the gate electrodes GE1 and GE2, the n⁺-type semiconductor region SD1, and the p⁺-type semiconductor region SD2 are exposed.

Subsequently, a metal film, such as a cobalt (Co) film or a nickel (Ni) film, is formed (deposited) by sputtering over the main surface (entire surface) of the semiconductor substrate 1 including the upper parts of the gate electrodes GE1 and GE2, the n$^+$-type semiconductor region SD1, and the p$^+$-type semiconductor region SD2. Then, by thermal treatment, the metal film reacts with the materials (respective silicon regions) contained in the gate electrodes GE1 and GE2, the n$^+$-type semiconductor region SD1, and the p$^+$-type semiconductor region SD2. Thus, the metal silicide layer 4 is formed over each of the surfaces of the gate electrodes GE1 and GE2, the n$^+$-type semiconductor region SD1, and the p$^+$-type semiconductor region SD2. When the metal film is a cobalt film, the metal silicide layer 4 is a cobalt silicide layer. When the metal film is a nickel film, the metal silicide layer 4 is a nickel silicide layer. When the metal film is a nickel-platinum alloy film, the metal silicide layer 4 is a nickel-platinum silicide layer. Thereafter, the non-reacted metal film is removed. The formation of the metal silicide layer 4 can decrease a diffusion resistance or a contact resistance of the gate electrodes GE1 and GE2, the n$^+$-type semiconductor region SD1 and the p$^+$-type semiconductor region SD2. When the metal silicide layer 4 is formed over the gate electrodes GE1 and GE2, the metal silicide layer 4 over the gate electrode GE1 can also be regarded as a part of the gate electrode GE1, and the metal silicide layer 4 over the gate electrode GE2 can be regarded as a part of the gate electrode GE2.

Figure 8:
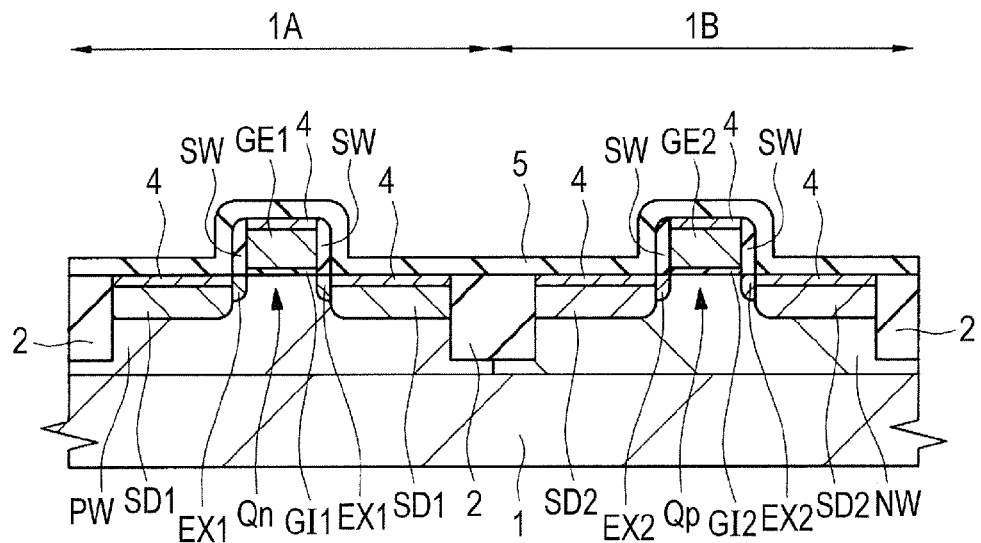
FIG. 8 is a cross-sectional view of a main part of another manufacturing step of the semiconductor device, following the step shown in FIG. 6.

Then, as shown in FIG. 8, a silicon nitride film (first insulating film) 5 is formed over the entire main surface of the semiconductor substrate 1 including the nMIS formation region 1A and the pMIS formation region 1B as an insulating film for the tensile stress (in step S1 shown in FIG. 7). The silicon nitride film 5 in the nMIS formation region 1A is formed to cover the gate electrode GE1, the sidewall spacers SW, and the n$^+$-type semiconductor region SD1. The silicon nitride film 5 in the pMIS formation region 1B is formed to cover the gate electrode GE2, the sidewall spacer SW, and the p$^+$-type semiconductor region SD2. That is, the silicon nitride film 5 is formed over the main surface of the semiconductor substrate 1 including the upper surface of the metal silicide layer 4 so as to cover the gate electrodes GE1 and GE2, the sidewall spacers SW, the n$^+$-type semiconductor region SD1, and the p$^+$-type semiconductor region SD2. In short, the silicon nitride film 5 is formed over the main surface of the semiconductor substrate 1 to cover the n-channel MISFETQn and the p-channel MISFETQp. Thus, in the nMIS formation region 1A, the n-channel MISFETQn is covered with the silicon nitride film 5, whereas, in the pMIS formation region 1B, the p-channel MISFETQp is covered with the silicon nitride film 5.

The silicon nitride film 5 formed in step S1 is a tensile stress film.

In the present embodiment and the following second embodiment of the invention, the tensile stress film is a film (insulating film) that applies a tensile stress to the semiconductor substrate, over which the tensile stress film is formed. In a region with the tensile stress film formed over the semiconductor substrate, the tensile stress film applies (gives or generates) the tensile stress to the semiconductor substrate. When the tensile stress is applied to the semiconductor substrate (channel region) with the n-channel MISFET formed therein by the tensile stress film, the mobility of electrons is increased, which can increase the on-state current flowing through the channel of the n-channel MISFET. The tensile stress film can be regarded as a stress film for tension, and the tensile stress film of silicon nitride can be regarded as a silicon nitride film having a tensile stress.

In contrast, the compressive stress film is a film (insulating film) that applies a compressive stress to the semiconductor substrate with the compressive stress film formed thereat. In a region with the compressive stress film formed over the semiconductor substrate, the compressive stress is applied (given or generated) to the semiconductor substrate by the compressive stress film. When the compressive stress is applied to the semiconductor substrate (channel region therein) with the p-channel MISFET formed thereat by the compressive stress film, the mobility of positive holes (holes) is increased, which can increase the on-state current flowing through the channel of the p-channel MISFET. The compressive stress film can be regarded as a stress film for compression, and the compressive stress film comprised of silicon nitride can be regarded as a silicon nitride film having the compression stress.

The silicon nitride film 5 can be formed using a plasma chemical vapor deposition (CVD) method. Specific conditions for deposition of the silicon nitride film 5 are as follows. For example, a mixture of a silane ($SiH_4$) gas, an ammonia ($NH_3$) gas, and a nitrogen ($N_2$) gas is introduced into a chamber for deposition at a gas-flow-rate ratio of $SiH_4:NH_3:N_2$ of about 1:5 to 10:5 to 20, using a parallel-plate type plasma CVD device, and an RF power (high-frequency power) of about 0.01 to 1 W/cm$^2$ is applied, so that a silicon nitride film 5 can be deposited over the semiconductor substrate 1. The temperature of deposition (temperature of the semiconductor substrate 1 during deposition) can be set to, for example, 250 to 450° C. The thickness (film thickness) of the formed silicon nitride film 5 can be preferably in a range of about 15 to 50 nm.

In step S1, the silicon nitride film 5 is formed as the tensile stress film. The tensile stress film can be formed by depositing a silicon nitride film (here, the silicon nitride film 5) by a plasma CVD method, while controlling deposition conditions (deposition temperature, the kind of deposition gas, gas pressure, high-frequency power, and the like) upon deposition. Thus, the silicon nitride film 5 obtained directly after the deposition in step S1 can be a tensile stress film.

The silicon nitride film 5 is deposited as the tensile stress film in step S1. From the viewpoint of depositing a film having a high tensile stress, the temperature of the deposition of the silicon nitride film 5 is preferably formed by the plasma CVD method at a temperature of 400° C. or more.

In order to further increase the tensile stress of the silicon nitride film deposited as the tensile stress film, an ultraviolet ray irradiation process is performed. The ultraviolet ray irradiation process (process for irradiation of ultraviolet rays) is performed on the silicon nitride film deposited as the tensile stress film using the plasma CVD method, which can result in formation of the silicon nitride film having a larger tensile stress than that before the irradiation of ultraviolet rays. The reason for increase in tensile stress of the silicon nitride film by the ultraviolet ray irradiation process is as follows. Hydrogen contained in the silicon nitride film formed by the ultraviolet ray irradiation process is detached to contract the silicon nitride film, which changes a bond angle between Si (silicon) and N (nitrogen) of the silicon nitride film (more specifically, which results in a small bond angle), thus increasing the tensile stress of the silicon nitride film. The hydrogen elements contained in the silicon nitride film are detached by the ultraviolet ray irradiation. Thus, the ultraviolet ray irradiation is a process for reducing a hydrogen content (concentration of hydrogen) of the silicon nitride film.

In this embodiment, the silicon nitride film 5 is deposited (preferably, deposited by the plasma CVD method) in step S1, and then the silicon nitride film 5 is irradiated with ultraviolet rays (in step S2 shown in FIG. 7).

The ultraviolet ray irradiation process in step S2 is preferably performed while heating the semiconductor substrate 1. The temperature of heating (temperature of the semiconductor substrate 1) can be in a range of, for example, 300 to 600° C. The ultraviolet ray irradiation process in step S2 is preferably performed under an inert gas atmosphere, for example, under an atmosphere of helium (He), argon (Ar), or nitrogen ($N_2$). The process for irradiation of the ultraviolet rays (that is, ultraviolet irradiation process) is hereinafter referred to as the ultraviolet (UV) irradiation process. The UV irradiation process in step S2 acts to increase the tensile stress of the silicon nitride film 5, and thus can be regarded as a process for increasing the tensile stress of the silicon nitride film 5. That is, the silicon nitride film 5 formed in step S1 is a tensile stress film. The UV irradiation process in step S2 can further increase the tensile stress of the silicon nitride film 5 as the tensile stress film.

The UV irradiation process in step S2 is applied to the silicon nitride film 5 over the entire main surface of the semiconductor substrate 1 including the nMIS formation region 1A and the pMIS formation region 1B. Thus, in step S2, both the silicon nitride film 5 in the nMIS formation region 1A and the silicon nitride film 5 in the pMIS formation region 1B are irradiated with the ultraviolet rays. Thus, the silicon nitride film 5 in the nMIS formation region 1A and the silicon nitride film 5 in the pMIS formation region 1B each have its tensile stress increased by the UV irradiation process in step S2 as compared to that before the UV irradiation. The silicon nitride film 5 in the nMIS formation region 1A and the silicon nitride film 5 in the pMIS formation region 1B each have a hydrogen content decreased by the UV irradiation process in step S2 as compared to that before the UV irradiation.

Before the UV irradiation, however, the tensile stress of the silicon nitride film 5 in the nMIS formation region 1A is substantially equal to that of the silicon nitride film 5 in the pMIS formation region 1B by comparison between the nMIS formation region 1A and the pMIS formation region 1B. Even after the UV irradiation in step S2, the tensile stress of the silicon nitride film 5 in the nMIS formation region 1A is also substantially equal to that of the silicon nitride film 5 in the pMIS formation region 1B. Before the UV irradiation, the hydrogen content of the silicon nitride film 5 in the nMIS formation region 1A is substantially equal to that of the silicon nitride film 5 in the pMIS formation region 1B by comparison between the nMIS formation region 1A and the pMIS formation region 1B. Even after the UV irradiation in step S2, the hydrogen content of the silicon nitride film 5 in the nMIS formation region 1A is also substantially equal to that of the silicon nitride film 5 in the pMIS formation region 1B.

An absolute value (absolute value of a stress) of a tensile stress of the silicon nitride film 5 (that is, the silicon nitride film 5 whose tensile stress is increased by the UV irradiation process in step S2) processed through steps S1 and S2 is preferably equal to or more than 1.4 GPa, so that the silicon nitride film 5 becomes a film having a high tensile stress that can improve the characteristics (on-state current) of the n-channel MISFETQn.

In this embodiment, the silicon nitride film 5 is deposited by the plasma CVD method in step S1, and the silicon nitride film 5 deposited in step S1 is subjected to the UV irradiation process in step S2. In this case, step S1 and step S2 are combined into and regarded as one cycle (one time) (that is, when the silicon nitride film 5 is comprised of a single layer film), which has been described above. In other embodiments, the cycle of the deposition process of the silicon nitride film in step S1 and the ultraviolet irradiation process in step S2 can be repeated a plurality of times (that is, a plurality of cycles is performed). Upon performing the cycle a plurality of times, the following process may be performed.

That is, the semiconductor substrate 1 (semiconductor wafer) is set in a chamber for deposition of a semiconductor manufacturing device, and a first silicon nitride film is formed (deposited) over the entire main surface of the semiconductor substrate 1 (in a step corresponding to step S1). Then, the semiconductor substrate 1 is delivered under vacuum into a chamber for irradiation of ultraviolet rays, and the first silicon nitride film over the main surface of the semiconductor substrate 1 is subjected to the ultraviolet ray irradiation process in the chamber (in a step corresponding to step S2). The ultraviolet ray irradiation process increases the tensile stress of the first insulating film and decreases the hydrogen content thereof. Thereafter, the semiconductor substrate 1 is delivered again into the chamber for deposition and a second silicon nitride film is formed (deposited) over the entire main surface (that is, the first silicon nitride film) of the semiconductor substrate 1 in the chamber for deposition (in the step corresponding to step S1). The semiconductor substrate 1 is delivered under vacuum into the chamber for irradiation of the ultraviolet rays, and then the second silicon nitride film over the main surface of the semiconductor substrate 1 is subjected to the ultraviolet ray irradiation process in the chamber (in a step corresponding to step S2). The ultraviolet ray irradiation process increases the tensile stress of the second insulating film and decreases the hydrogen content thereof. This process is repeated until the total thickness of the silicon nitride film formed (deposited) reaches a predetermined thickness, whereby the silicon nitride film 5 can be formed as the tensile stress film. One cycle including the step of deposition of the silicon nitride film corresponding to step S1 and the step of irradiation of the ultraviolet rays corresponding to step S2 is repeated "n" times (note that n is an integral number). In this case, the silicon nitride film 5 having the tensile stress and obtained after the "n" times repetition of the cycle becomes a laminated film of the first to n-th silicon nitride films. The respective silicon nitride films (each of the first to n-th silicon nitride films) forming the laminated film are irradiated with the UV after being deposited.

Thus, the process for forming the silicon nitride film 5 serving to provide the tensile stress can be as follows. That is, the first step (corresponding to the above step S1) of forming (depositing) the silicon nitride film and the second step (corresponding to the above step S2) of applying the ultraviolet ray irradiation process to the silicon nitride film formed (deposited) in the first step are combined into and regarded as one cycle. The cycle is repeated one or more times. Thus, the silicon nitride film 5 serving as a tensile stress film is formed to cover the n-channel MISFETQn and the p-channel MISFETQp over the semiconductor substrate 1. At this time, the tensile stress of the silicon nitride film formed (deposited) in the first step is increased by the ultraviolet irradiation process performed in the second step. The hydrogen content of the silicon nitride film formed (deposited) in the first step is decreased by the ultraviolet irradiation process performed in the second step. Thereafter, step S3 to be described later and the following steps are performed.

The only one cycle of the deposition of the silicon nitride film in step S1 and the ultraviolet ray irradiation process in step S2 is performed (in this case, the silicon nitride film 5 being a single layer film), which can reduce the manufacturing time to improve the throughput. Alternatively, the cycle of the deposition process of the silicon nitride film in step S1 and the ultraviolet ray irradiation process in step S2 is repeated a plurality of times, that is, a plurality of cycles are performed (in this case, the silicon nitride film 5 becoming a laminated film of a plurality of silicon nitride films), which advantageously forms the silicon nitride film 5 having a large tensile stress with ease.

Figure 9:
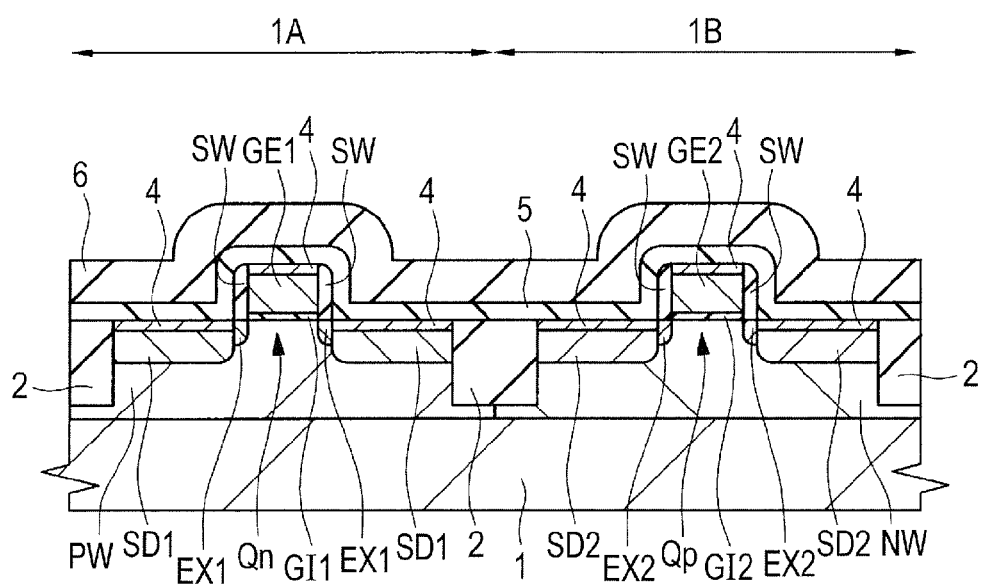
FIG. 9 is a cross-sectional view of a main part of another manufacturing step of the semiconductor device, following the step shown in FIG. 8.

After the UV irradiation process in step S2 (after the process in step S2 in the last cycle when the process in step S1 and the process in step S2 are repeated a plurality of times or in a plurality of cycles), as shown in FIG. 9, the material film 6 for the mask layer is formed over the entire main surface of the semiconductor substrate 1 including the nMIS formation region 1A and the pMIS formation region 1B, that is, over the silicon nitride film 5 (in step S3 shown in FIG. 7).

When the process in step S7 (removal step of the mask layer 6a) to be described later is omitted (which corresponds to the processes shown in FIGS. 23 and 24 to be described later), the material film 6 needs to have insulating properties (that is, the material film 6 needs to be an insulating film). When the mask layer 6a is removed in step S7 to be described later, the material film 6 is more preferably the insulating film, taking into consideration residues obtained after the removal, but is allowed not to be the insulating film. For example, a silicon nitride film can be used as the material film 6. In this case, the material film can be formed using the CVD method or the like. For example, the material film 6 comprised of a silicon oxide film can be formed using a subatmospheric CVD (SACVD) method.

Figure 10:
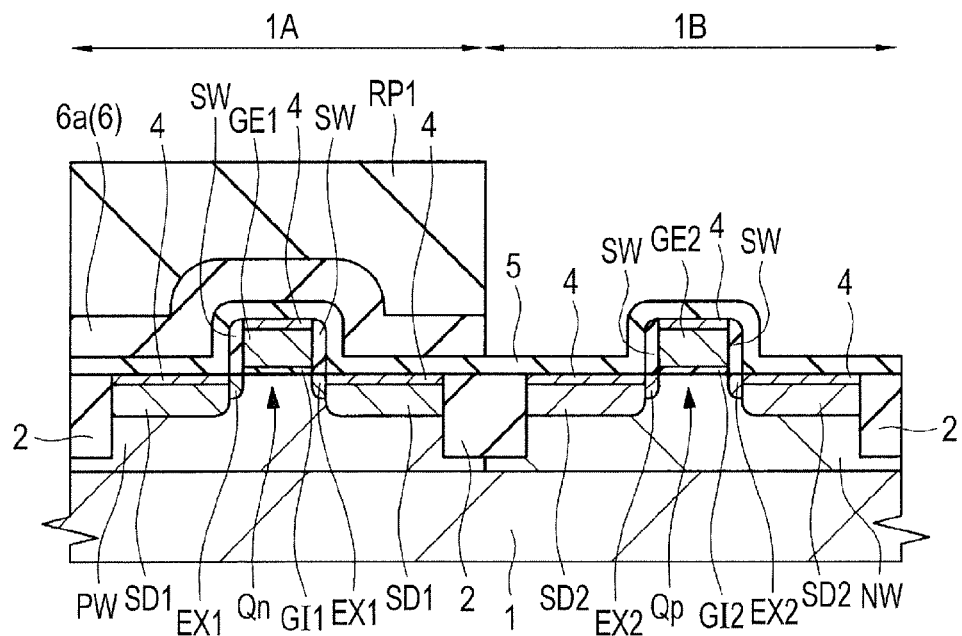
FIG. 10 is a cross-sectional view of a main part of another manufacturing step of the semiconductor device, following the step shown in FIG. 9.

Then, as shown in FIG. 10, a photoresist pattern RP1 is formed over the material film 6 by photolithography so as to cover the nMIS formation region 1A and to expose the pMIS formation region 1B (in step S4 shown in FIG. 7).

Then, the material film 6 in the pMIS formation region 1B is removed by etching using the photoresist pattern RP1 as an etching mask (in step S5 shown in FIG. 7). As a result, the material film 6 in the pMIS formation region 1B is removed to expose the silicon nitride film 5. In contrast, in the nMIS formation region 1A, the photoresist pattern RP1 serves as an etching mask, so that the material film 6 remains as the mask layer 6a without being removed. The silicon nitride film 5 is not exposed in the nMIS formation region 1A. FIG. 10 shows the stage in which the etching process in step S5 is performed.

The mask layer 6a is comprised of the material film 6 remaining in the nMIS formation region 1A. The mask layer 6a is formed in the nMIS formation region 1A and not in the pMIS formation region 1B. Thus, the mask layer 6a covers the silicon nitride film 5 in the nMIS formation region 1A, while exposing the silicon nitride film 5 in the pMIS formation region 1B.

Figure 11:
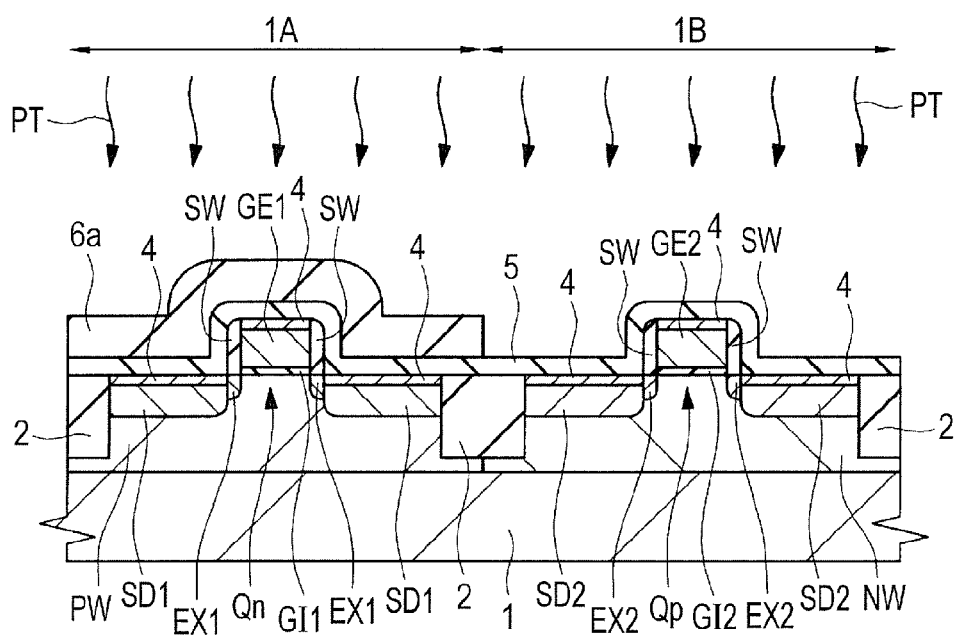
FIG. 11 is a cross-sectional view of a main part of another manufacturing step of the semiconductor device, following the step shown in FIG. 10.

The material film 6 is etched in step S5 on conditions in which the material film 6 is etched more than the silicon nitride film 5. Thus, the material film 6 is preferably a film made of material that easily tends to ensure an appropriate etching selectivity of the material film 6 to the silicon nitride film 5. The material film 6 is made of the material different from that of the silicon nitride film 5. The material film 6 made of the silicon oxide film is more preferably etched because the etching selectivity (ratio of the etching rate of the material film 6 to that of the silicon nitride film 5; namely, etching rate ratio of the material film 6/silicon nitride film 5) can be increased to etch the material film 6. In the etching in step S5, the dry etching or wet etching can be used. The thickness of the mask layer 6a (thus, the formation thickness of the material film 6) is preferably in a range of 10 to 200 nm. After the etching process in step S5, as shown in FIG. 11, the photoresist pattern RP1 is removed.

Then, the plasma processing is performed (in step S6 shown in FIG. 7). In the plasma processing in step S6, the semiconductor substrate 1 is subjected to plasma. The plasma processing in step S6 causes the main surface of the semiconductor substrate 1 to be exposed to the plasma, and thus can be regarded as a process for irradiating the main surface of the semiconductor substrate 1 with the plasma. Referring to FIG. 11, the plasma processing is exemplarily represented by the arrows (arrows indicated by the reference character PT).

Directly before the plasma processing in step S6, in the pMIS formation region 1B, the silicon nitride film 5 is exposed, and in the nMIS formation region 1A, the silicon nitride film 5 is not exposed and covered with the mask layer 6a over the main surface of the semiconductor substrate 1. Then, the plasma processing is performed in step S6 in such a state that the mask layer 6a is exposed in the region 1A. That is, directly before the plasma processing in step S6, the silicon nitride film 5 is positioned as the uppermost layer in the pMIS formation region 1B, and the mask layer 6a is positioned as the uppermost layer in the nMIS formation region 1A. In this state, the plasma processing is performed in step S6. The plasma processing in step S6 is performed with the silicon nitride film 5 in the pMIS formation region 1B exposed without exposing the silicon nitride film 5 in the nMIS formation region 1A. The plasma processing in step S6 can be regarded as a step of performing plasma processing on the silicon nitride film 5 in the pMIS formation region 1B (that is, of the silicon nitride film 5 covering the p-channel MISFETQp).

The plasma processing in step S6 is a process for relieving (reducing) the stress of the silicon nitride film 5 in the pMIS formation region 1B. The reason for relieving (reducing) the stress of the silicon nitride film by the plasma processing is as follows. A bonding structure between Si (silicon) and N (nitrogen) in the silicon nitride film is changed by the plasma, which changes a bond angle between Si (silicon) and N (nitrogen) (which results in an increase in bond angle in the silicon nitride film having the tensile stress), thus relieving (reducing) the stress of the silicon nitride film. Unlike the ultraviolet ray irradiation process, the plasma processing detaches relatively few hydrogen elements from the silicon nitride film, and thus hardly changes the hydrogen content (hydrogen concentration) of the silicon nitride film.

In this embodiment and the following second embodiment, the phrase "relieve the stress of the film" means that "an absolute value of a stress of the film is reduced (decreased)". When the film is a tensile stress film, the phrase means that the tensile stress of the film is reduced. When the film is a compressive stress film, the phrase means that the compressive stress of the film is reduced. Since the silicon nitride film 5 is the tensile stress film in this embodiment, the plasma processing in step S6 is a process for relieving (reducing) the tensile stress of the silicon nitride film 5 in the pMIS formation region 1B. In contrast, since the silicon nitride film 5a is the compressive stress film in a second embodiment to be descried later, the plasma processing in step S6a to be described later is a process for relieving (decreasing) the compressive stress of the silicon nitride film 5a in the nMIS formation region 1A.

Upon the plasma processing in step S6, the silicon nitride film 5 is exposed in the pMIS formation region 1B, and then irradiated with plasma (specifically, the silicon nitride film 5 in the pMIS formation region 1B is subjected to plasma). Thus, the stress (or tensile stress) of the silicon nitride film 5 in the pMIS formation region 1B is relieved (reduced). In the nMIS formation region 1A, the mask layer 6a is formed over the silicon nitride film 5 without exposing the silicon nitride film 5. Even after the plasma processing in step S6, the silicon nitride film 5 in the nMIS formation region 1A is not irradiated with plasma (that is, the silicon nitride film 5 in the nMIS formation region 1A is not exposed to the plasma). Thus, even after the plasma processing in step S6, the stress (tensile stress) of the silicon nitride film 5 in the nMIS formation region 1A is hardly relieved (reduced).

This embodiment uses the feature that the tensile stress of the silicon nitride film 5 is relieved (decreased) as a tensile stress film when the silicon nitride film 5 is irradiated with the plasma. The silicon nitride film 5 is exposed in the pMIS formation region 1B without exposing the silicon nitride film 5 in the nMIS formation region 1A (specifically, the silicon nitride film 5 being covered with the mask layer 6a in the nMIS formation region 1A). In this state, the plasma processing in step S6 is performed, so that the silicon nitride film 5 in the pMIS formation region 1B is irradiated with the plasma, whereas the silicon nitride film 5 in the nMIS formation region 1A is not irradiated with the plasma. This arrangement can relieve (decreases) the tensile stress of the silicon nitride film 5 in the pMIS formation region 1B, and can maintain (cannot relieve) the tensile stress of the silicon nitride film 5 in the nMIS formation region 1A.

By the performance of the plasma processing in step S6, the tensile stress of the silicon nitride film 5 in the pMIS formation region 1B is smaller than that of the silicon nitride film 5 in the nMIS formation region 1A. That is, after the plasma processing in step S6, the tensile stress of the silicon nitride film 5 in the pMIS formation region 1B is smaller than that of the silicon nitride film 5 in the nMIS formation region 1A. This state (magnitude relationship about the stress) is also maintained in the manufactured semiconductor device. Specifically, by performance of the plasma processing in step S6, the tensile stress of the nitride silicon film 5 in the pMIS formation region 1B is preferably equal to or less than a half the tensile stress of the silicon nitride film 5 in the nMIS formation region 1A. This state (relationship that the tensile stress of the film 5 in the region 1B is equal to or less than a half that of the film 5 in the region 1A) is also maintained in the manufactured semiconductor device.

The plasma processing in step S6 can include hydrogen plasma processing (plasma processing using hydrogen ($H_2$) gas), helium plasma processing (plasma processing using helium (He) gas), argon plasma process (plasma processing using argon (Ar) gas), nitrogen plasma processing (plasma processing using nitrogen ($N_2$) gas), or ammonia plasma processing (plasma processing using ammonia ($NH_3$) gas). Alternatively, the plasma processing in step S6 can use plasma processing using a combined gas of two or more kinds of hydrogen ($H_2$) gas, helium ($H_2$) gas, argon (Ar) gas, nitrogen ($N_2$) gas, and ammonia ($NH_3$) gas. The plasma processing in step S6 is more preferably the hydrogen plasma processing. The hydrogen plasma processing is performed as the plasma processing in step S6, so that the tensile stress of the silicon nitride film 5 in the pMIS formation region 1B can be relieved (decreased) most effectively.

The plasma processing in step S6 is preferably performed by heating the semiconductor substrate 1. The temperature of heating (temperature of the semiconductor substrate 1) can be, for example, in a range of 300 to 500° C. When the temperature of the semiconductor substrate 1 becomes too high upon the plasma processing in step S6, the resistance of the metal silicide layer 4 would be increased, and this decreases the characteristics of the transistor. In contrast, when the temperature of the semiconductor substrate 1 becomes too low upon the plasma processing in step S6, the effect of relieving the tensile stress of the silicon nitride film 5 would be reduced. From this viewpoint, the temperature (heating temperature) of the semiconductor substrate 1 upon the plasma processing in step S6 is set in the above temperature range (of 300 to 500° C.), which can surely relieve (reduce) the tensile stress of the silicon nitride film 5, while preventing the reduction in transistor characteristics. In the plasma processing in step S6, the high-frequency power can be set to, for example, about 0.1 to 10 W/cm$^2$, and the pressure can be set to, for example, about 0.1 to 50 Torr.

Figure 12:
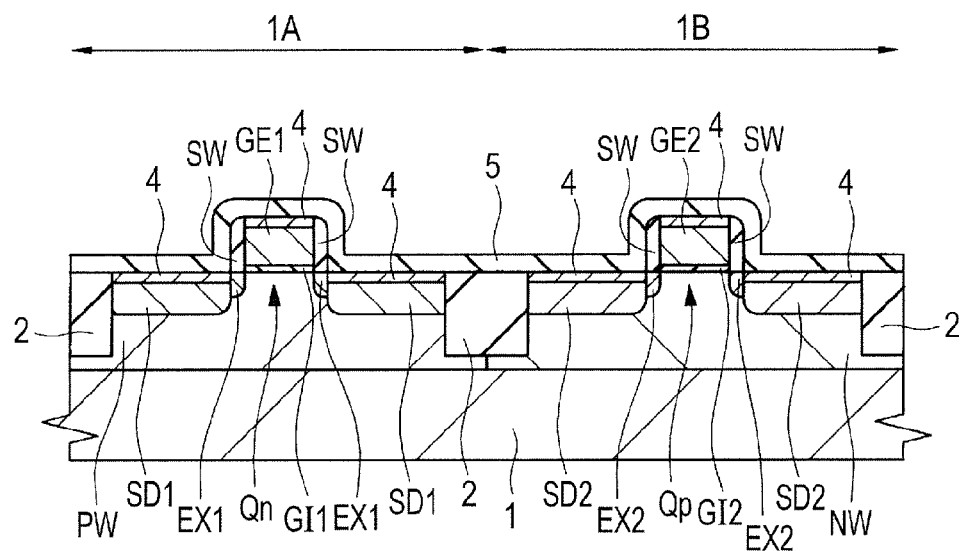
FIG. 12 is a cross-sectional view of a main part of another manufacturing step of the semiconductor device, following the step shown in FIG. 11.

After the plasma processing in step S6, as shown in FIG. 12, the mask layer 6a is removed by etching or the like (in step S7 shown in FIG. 7).

Since the mask layer 6a is removed in step S7, the mask layer 6a (and thus also the material film 6) may not be an insulating film. In order to prevent inconveniences due to the resides obtained after the removal of the mask layer 6a, the mask layer 6a (and thus also the material film 6) may be more preferably comprised of the insulating film. In the processes shown in FIGS. 23 and 24 to be described later, the interlayer insulating film 7 is formed without removing the mask layer 6a. Thus, the mask layer 6a (and thus also the material film 6) needs to be an insulating film.

Since the mask layer 6a is formed over the silicon nitride film 5 in the nMIS formation region 1A, the mask layer 6a in the nMIS formation region 1A is etched and removed in step S7. In contrast, in the pMIS formation region 1B, the material film 6 is already removed in the above step S5, so that before and after step S7 the silicon nitride film 5 is exposed. By removing the mask layer 6a in step S7, the silicon nitride film 5 is exposed not only in the pMIS formation region 1B, but also in the nMIS formation region 1A, whereby the uppermost layer over the main surface of the semiconductor substrate 1 is comprised of the silicon nitride film 5 in the nMIS formation region 1A and the pMIS formation region 1B.

In the etching at step S7, the mask layer 6a is etched on the conditions in which the mask layer 6a is etched more than the silicon nitride film 5. Thus, the mask layer 6a is preferably a material film that tends to ensure the appropriate etching selectivity to the silicon nitride film 5. Thus, the mask layer 6a is made of material different from that of the silicon nitride film 5. The mask layer 6a comprised of a silicon oxide film is more preferable because the etching selectivity (ratio of the etching rate of the mask layer 6a to the etching rate of the silicon nitride film 5, that is, the etching rate ratio of the mask layer 6a/silicon nitride film 5) tends to be increased. The etching processing in step S7 can use dry etching or wet etching.

Figure 13:
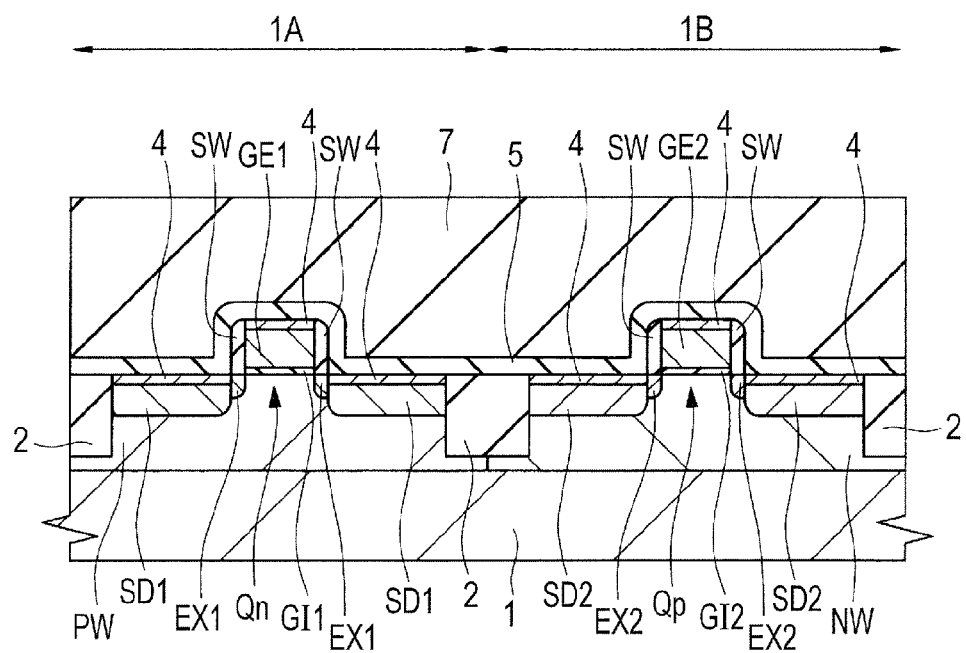
FIG. 13 is a cross-sectional view of a main part of another manufacturing step of the semiconductor device, following the step shown in FIG. 12.

Then, as shown in FIG. 13, an interlayer insulating film (insulating film) 7 is formed as an insulating film of silicon oxide over the entire main surface of the semiconductor substrate 1 including the nMIS formation region 1A and the pMIS formation region 1B, that is, over the silicon nitride film 5 (in step S8 shown in FIG. 7). The interlayer insulating film 7 is thicker than the silicon nitride film 5. The interlayer insulating film 7 for use is an insulating film made of silicon oxide (that is, oxide film-based insulating film). The silicon oxide-based insulating film (oxide film-based insulating film) is an insulating film containing silicon oxide as a principal component, but can further contain one or more kinds of elements selected from the group consisting of carbon (C), fluorine (F), nitrogen (N), boron (B), and phosphorous (P).

After forming the interlayer insulating film 7, the upper surface of the interlayer insulating film 7 is planarized by polishing the surface (upper surface) of the interlayer insulating film 7 by a chemical mechanical polishing (CMP) method or the like.

Figure 14:
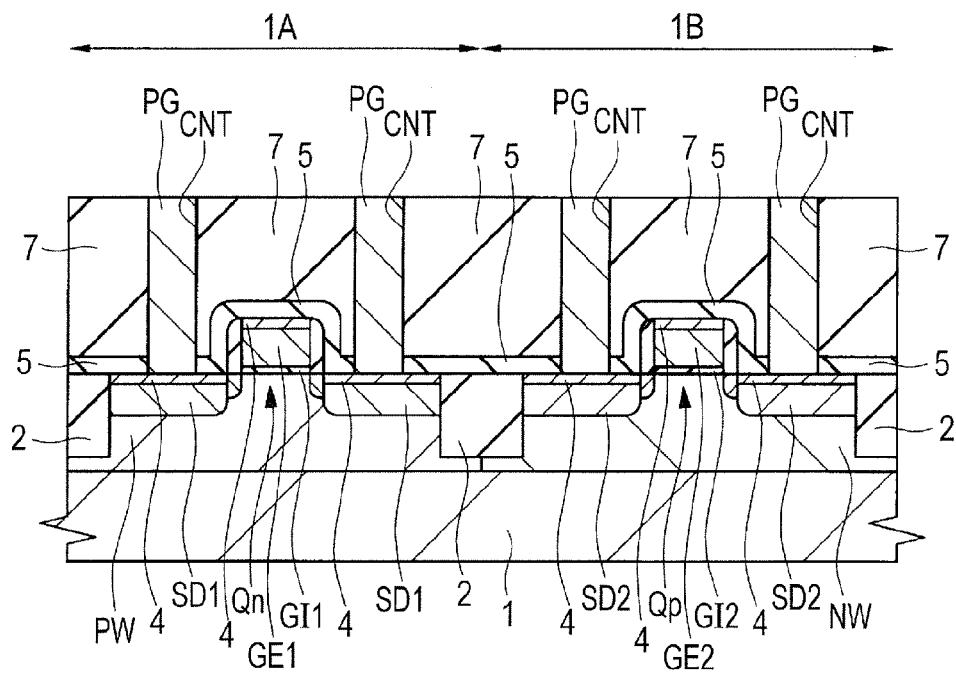
FIG. 14 is a cross-sectional view of a main part of another manufacturing step of the semiconductor device, following the step shown in FIG. 13.

Thereafter, the interlayer insulating film 7 and the silicon nitride film 5 are dry-etched using a photoresist pattern (not shown) formed over the interlayer insulating film 7 as an etching mask, so that contact holes (through holes, openings) CNT are formed in the interlayer insulting film 7 and the silicon nitride film 5 as shown in FIG. 14. Each contact hole CNT is formed to penetrate the laminated film (laminated insulating film) comprised of the interlayer insulating film 7 and the silicon nitride film 5.

In order to form the contact holes CNT, the interlayer insulating film 7 is dry-etched on the conditions in which the interlayer insulating film 7 is etched more than the silicon nitride film 5, and the silicon nitride film 5 serves as an etching stopper film, whereby the contact holes CNT are formed in the interlayer insulating film 7. Then, the silicon nitride film 5 at the bottom of the contact hole CNT is removed by dry etching on the other conditions in which the silicon nitride film 5 is etched more than the interlayer insulating film 7, whereby the complete contact holes CNT are formed as the through hole. It will be understood, however, that the contact holes CNT in the nMIS formation region 1A pass through silicon nitride film 5 whose tensile stress differs from (in particular, is greater than) the tensile stress of contact holes CNT passing through silicon nitride film 5 in the pMIS formation region 1B.

The metal silicide layer 4 over the $n^+$-type semiconductor region SD1 is exposed at the bottom of each contact hole CNT formed over the $n^+$-type semiconductor region SD1. Further, the metal silicide layer 4 over the $p^+$-type semiconductor region SD2 is exposed at the bottom of each contact hole CNT formed over the $p^+$-type semiconductor region SD2. The silicon nitride film 5 serves as the etching stopper film upon forming the contact holes CNT, which can suppress or prevent the excessive digging of the contact hole CNT or the damage on the substrate.

Then, a conductive plug (conductor for connection) PG comprised of tungsten (W) is formed (embedded) in each contact hole CNT. In order to form the plug PG, a barrier conductive film (for example, a titanium film, a titanium nitride film, or a laminated film thereof) is formed over the interlayer insulating film 7 including the inside (bottom and sidewalls) of each contact hole CNT. Then, the main conductive film comprised of the tungsten film or the like is formed over the bather conductive film to fill in the contact hole CNT, and unnecessary parts of the main conductive film and the bather conductive film over the interlayer insulating film 7 are removed by the CMP method or the etching back method, whereby the plugs PG can be formed. For simplifying the drawings, FIG. 14 illustrates the integration of the bather conductive film and the main conductive film (tungsten film) which are included in the plug PG. The plug PG formed over the $n^+$-type semiconductor region SD1 has its bottom brought into contact with and electrically coupled to the metal silicide layer 4 over the surface of the $n^+$-type semiconductor region SD1. The plug PG formed over the $p^+$-type semiconductor region SD2 has its bottom brought into contact with and electrically coupled to the metal silicide layer 4 over the surface of the $p^+$-type semiconductor region SD2.

Figure 15:
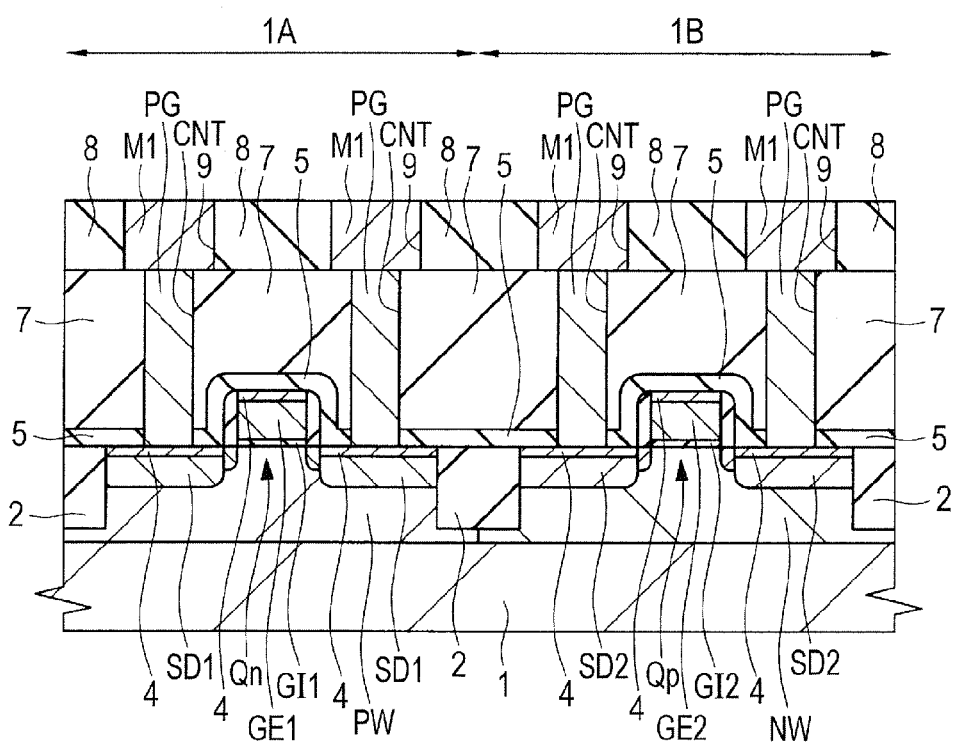
FIG. 15 is a cross-sectional view of a main part of another manufacturing step of the semiconductor device, following the step shown in FIG. 14.

Then, as shown in FIG. 15, an insulating film (interlayer insulating film) 8 for formation of wiring is formed over the interlayer insulating film 7 with the plugs PG embedded therein. The insulating film 8 can be a single film (single insulating film) or a laminated film (laminated insulating film).

Then, a first layer wiring is formed by a single damascene method. First, wiring trenches 9 are formed in predetermined regions of the insulating film 8 by dry etching using a photoresist pattern (not shown) as a mask, and then a bather conductive film (barrier metal film) is formed over the main surface of the semiconductor substrate 1 (that is, over the insulating film 8 including the bottom and sidewalls of the wiring trenches 9). The barrier conductive film can be formed, for example, using a titanium nitride film, a tantalum film, or a tantalum nitride film. Subsequently, a copper seed layer (not shown) is formed over the bather conductive film by the CVD method or sputtering method, and further a copper plating film (main conductive film) is formed over the seed layer using electrolytic plating or the like. The inside of the wiring trench 9 is filled with the copper plating film. Then, the copper plating film, the seed layer, and the bather metal film in regions other than the wiring trenches 9 are removed by the CMP method to thereby form the first layer wiring M1 containing copper as a main conductive material. For simplifying the drawings, FIG. 15 illustrates the integration of the copper plating film, the seed layer, and the bather metal film, which are included in the wiring M1. The wiring M1 is coupled to the plug PG and thus electrically coupled to the $n^+$-type semiconductor region SD1 for the source or drain of the n-channel MISFETQn or the gate electrode GE via the plug PG.

Thereafter, second or later layer wirings are formed by a dual damascene method, and the illustration and description thereof will be omitted below. The wiring M1 is not limited to a damascene wiring. The wiring M1 can be formed by patterning a conductive film for wiring. The wiring M1 can be, for example, a tungsten wiring or an aluminum wiring.

Main Features of this Embodiment

In this embodiment, the silicon nitride film 5 as the tensile stress film is formed to cover the n-channel MISFETQn, which can increase the mobility of electrons in the channel region flowing through the n-channel MISFETQn, thus increasing the on-state current (driving current) flowing through the channel of the n-channel MISFETQn. This arrangement can improve the performance of the semiconductor device including the n-channel MISFETQn.

A SiON film (silicon oxynitride film) or a SiCN film (silicon carbonitride film) in addition to the silicon nitride film serves as a tensile stress film. However, the SiON film or SiCN film hardly has a high tensile stress as compared to the silicon nitride film. In this embodiment, the silicon nitride film 5 is used as the tensile stress film. For this reason, this embodiment can use the tensile stress film (here, silicon nitride film 5) comprised of silicon nitride to increase the tensile stress acting on the semiconductor substrate, and thus can improve the effect of the on-state current (driving current) of the n-channel MISFETQn. The tensile stress of the silicon nitride film 5 in the nMIS formation region 1A (the part of the silicon nitride film 5 covering the n-channel MISFETQn) is more preferably equal to or more than 1.4 GPa (note that the absolute value of the stress is equal to or more than 1.4 GPa).

In this embodiment and the following embodiments, the term "silicon nitride film" as used therein does not exclude a film containing a small amount of oxygen or carbon (silicon nitride film).

Figure 16:
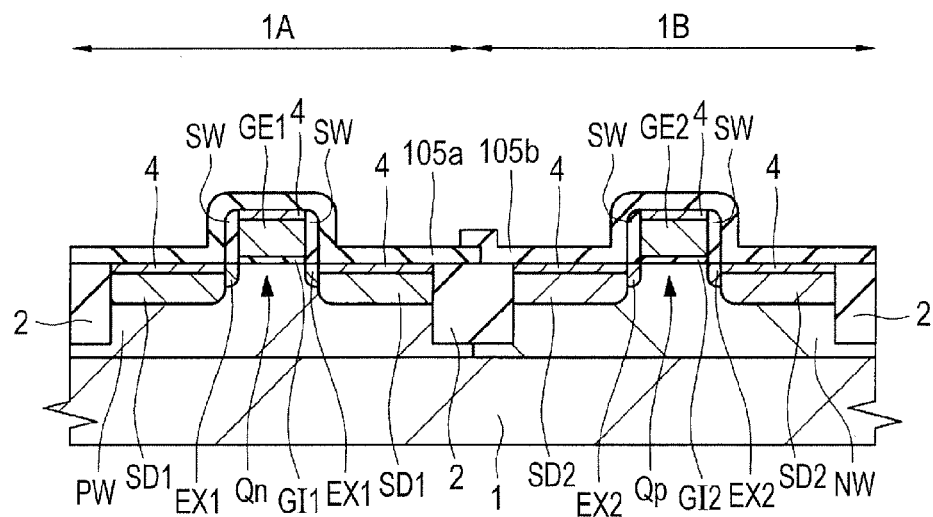
FIG. 16 is a cross-sectional view of a main part of a manufacturing step of a semiconductor device in a first comparative example.
Figure 17:
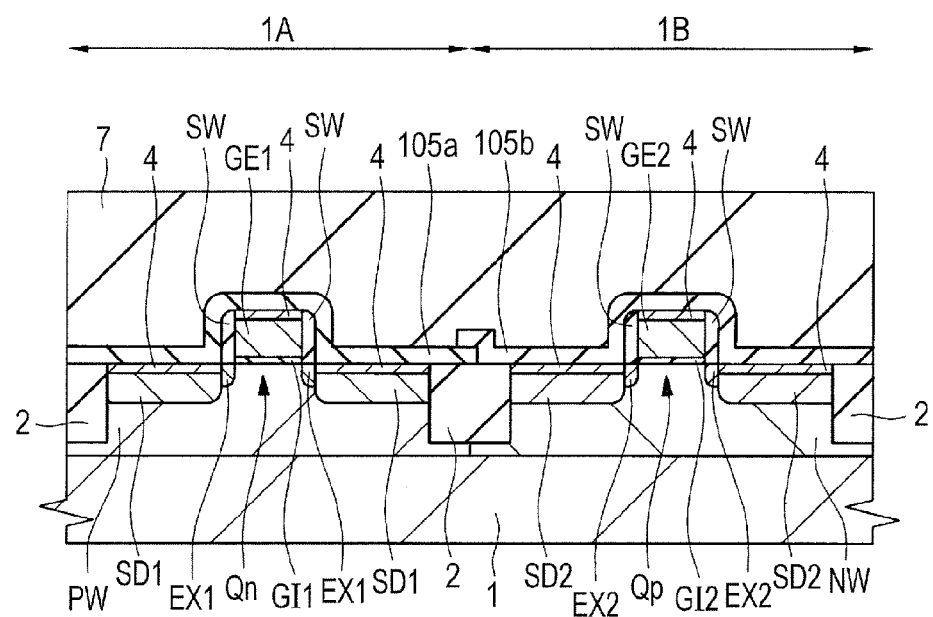
FIG. 17 is a cross-sectional view of a main part of another manufacturing step of the semiconductor device in the first comparative example, following the step shown in FIG. 16.

FIGS. 16 and 17 are cross-sectional views of main parts of manufacturing steps of a semiconductor device in the first comparative example. Different silicon nitride films 105a and 105b are formed in the nMIS formation region 1A and the pMIS formation region 1B, respectively. The manufacturing steps in the first comparative example will be described below with reference to FIGS. 16 and 17.

That is, after obtaining the structure shown in FIG. 6 by the salicide process, in the manufacturing process in the first comparative example as shown in FIG. 16, a first silicon nitride film 105a having a tensile stress is formed over the entire main surface of the semiconductor substrate 1, and then the first silicon nitride film 105a in the nMIS formation region 1A is left, while the first silicon nitride film 105a in the pMIS formation region 1B is removed. After forming a second silicon nitride film 105b having a compressive stress over the entire main surface of the semiconductor substrate 1, the second silicon nitride film 105b in the pMIS formation region 1B is left, while the second silicon nitride film 105b in the nMIS formation region 1A is removed. Thus, the n-channel MISFETQn in the nMIS formation region 1A is covered with the first silicon nitride film 105a having the tensile stress, whereas the p-channel MISFETQp in the pMIS formation region 1B is covered with the second silicon nitride film 105b having the compressive stress. Then, as shown in FIG. 17, the interlayer insulating film 7 is formed over the main surface of the semiconductor substrate 1. Thereafter, the elements corresponding to the above contact holes CNT, the plugs PG, the insulating film 8, the wiring trench 9, and the wiring M1 are formed. Thus, the illustration and description thereof will be omitted below.

In the first comparative example shown in FIGS. 16 and 17, the n-channel MISFETQn in the nMIS formation region 1A is covered with the first silicon nitride film 105a having the tensile stress, and the p-channel MISFETQp in the pMIS formation region 1B is covered with the second silicon nitride film 105b. Thus, the n-channel MISFETQn can increase the mobility of electrons in the channel region by the tensile stress of the first silicon nitride film 105a to thereby increase the on-state current flowing through the channel. Further, the p-channel MISFETQp can increase the mobility of holes (positive holes) in the channel region by the compressive stress of the second silicon nitride film 105b to thereby increase the on-state current flowing through the channel.

In the first comparative example shown in FIGS. 16 and 17, however, the first and second silicon nitride films 105a and 105b are individually formed in the nMIS formation region 1A and the pMIS formation region 1B, respectively, which would generate a part near the boundary between the nMIS formation region 1A and the pMIS formation region 1B where the silicon nitride film 105a having the tensile stress is partly superimposed on the silicon nitride film 105b having the compressive stress. This would cause peeling of the film (phenomenon of peeling the upper layer side film at the superimposed part) or generation of foreign material (generation of foreign matter due to the peeling of the film), and thus leads to a decrease in manufacturing yield, and also would form a stepped portion.

In contrast, in the first embodiment, the silicon nitride film 5 common to both the nMIS formation region 1A and the pMIS formation region 1B is formed. Unlike the first comparative example shown in FIGS. 16 and 17, the first embodiment prevents the stress film for the n-channel MISFETQn from being superimposed on the stress film for the p-channel MISFETQp, and thus can prevent the peeling of the film and the generation of foreign matter due to the superimposed part to thereby improve the manufacturing yield. Therefore, in contrast to the stepped films 105a, 105b of the comparative example shown in FIGS. 16 and 17, the silicon nitride film 5 of the first embodiment is a continuous (i.e., non-stepped) insulating film between the gates GE1, GE2 of MISFETs belonging to separate formation regions 1A, 1B. Further, the silicon nitride film 5 common to both the nMIS formation region 1A and the pMIS formation region 1B can serve as an etching stopper film upon forming the contact hole CNT for the nMIS formation region 1A and the contact hole CNT for the pMIS formation region 1B, which can suppress or prevent the excessive digging of the contact holes CNT and the damage on the substrate.

In the first embodiment, the common silicon nitride film 5 is formed both in the nMIS formation region 1A and the pMIS formation region 1B. Thus, the silicon nitride film 5 covers not only the n-channel MISFETQn, but also the p-channel MISFETQp. One part of the silicon nitride film 5 covering the n-channel MISFETQn preferably has a large tensile stress, and another part of the silicon nitride film 5 covering the p-channel MISFETQp preferably has a small tensile stress. This is because, if the silicon nitride film 5 covering the p-channel MISFETQp has a large tensile stress, the tensile stress acts to decrease the mobility of holes (positive holes) in the channel region of the p-channel MISFETQp, and also to decrease the characteristics of the p-channel MISFETQp (for example, the on-state current).

For this reason, in the first embodiment, the silicon nitride film 5 common to the nMIS formation region 1A and the pMIS formation region 1B is formed, but the stress of the common silicon nitride film 5 in the nMIS formation region 1A is not common to (not the same as) that in the pMIS formation region 1B.

That is, in the first embodiment, the silicon nitride film 5 is formed over both the nMIS formation region 1A and the pMIS formation region 1B, but the tensile stress of the silicon nitride film 5 in the nMIS formation region 1A is larger than that of the silicon nitride film 5 in the pMIS formation region 1B. That is, the tensile stress of the silicon nitride film 5 covering the n-channel MISFETQn is larger than that of the silicon nitride film 5 covering the p-channel MISFETQp. In other words, the tensile stress of the silicon nitride film 5 in the pMIS formation region 1B is smaller than that of the silicon nitride film 5 in the nMIS formation region 1A. That is, the tensile stress of the silicon nitride film 5 covering the p-channel MISFETQp is smaller than that of the silicon nitride film 5 covering the n-channel MISFETQn. This state (relationship about the tensile stress) is established by the plasma processing in the step S6. After the plasma process in the above step S6, that is, even in the manufactured semiconductor device, this state is maintained.

Thus, the silicon nitride film 5 applies a large tensile stress to the n-channel MISFETQn (channel region thereof) in the nMIS formation region 1A, and thus can surely improve the characteristics (on-state current) of the n-channel MISFETQn. In contrast, the silicon nitride film 5 can decrease the tensile stress applied to the p-channel MISFETQp (channel region thereof) in the pMIS formation region 1B, and thus can suppress or prevent the decrease in characteristics (for example, on-state current) of the p-channel MISFETQp. Thus, the characteristics (for example, on-state current) of the n-channel MISFET can be improved, while suppressing or preventing the reduction in characteristics (for example, on-state current) of the p-channel MISFETQp. This arrangement can improve the performance of the semiconductor device with the CMISFET.

From this viewpoint, more preferably, the tensile stress of the silicon nitride film 5 in the nMIS formation region 1A is at least twice as large as that of the silicon nitride film 5 in the pMIS formation region 1B (that is, when the tensile stress of the silicon nitride film 5 covering the n-channel MISFETQn is at least twice as large as that of the silicon nitride film 5 covering the p-channel MISFETQp). Specifically, the tensile stress of the silicon nitride film 5 in the nMIS formation region 1A is more preferably equal to or more than 1.4 GPa (note that the absolute value of the stress is 1.4 GPa or more).

In the first embodiment, the tensile stress of the silicon nitride film 5 in the pMIS formation region 1B is relieved (decreased) by the plasma processing in the above step S6, which can ensure a difference in tensile stress between the silicon nitride film 5 in the nMIS formation region 1A and the silicon nitride film 5 in the pMIS formation region 1B. The stress of the silicon film can be relieved by the plasma processing, which will be described below with reference to FIG. 18.

Figure 18:
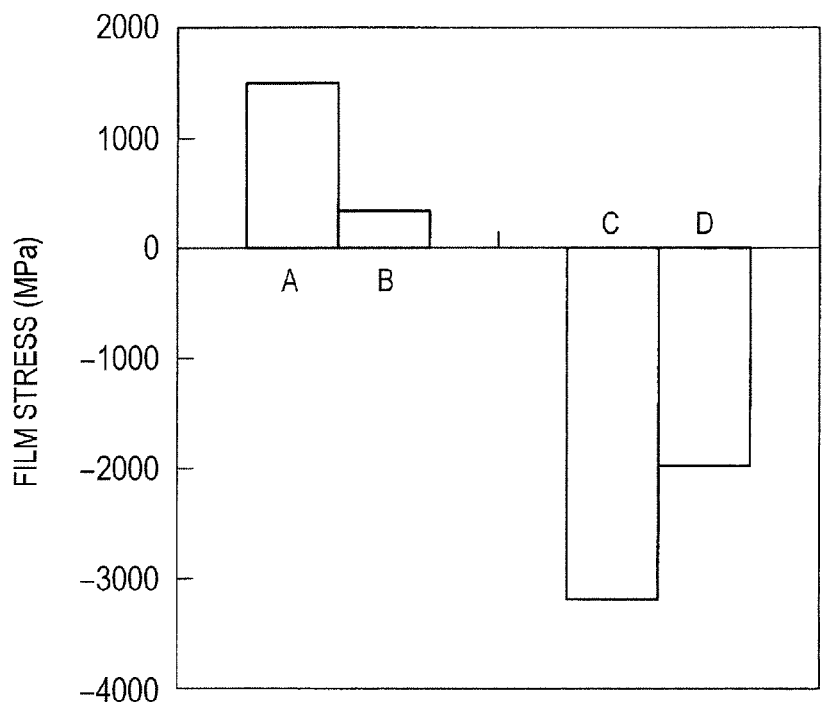
FIG. 18 is a graph showing a change in stress of a stress film formed on a main surface of a semiconductor substrate upon applying plasma processing to the film.

FIG. 18 is a graph (explanation diagram) showing a change in tensile stress of the stress film (silicon nitride film) subjected to the plasma processing after being formed over the main surface of the semiconductor substrate (semiconductor wafer). In FIG. 18, the longitudinal axis of the graph corresponds to the stress of the stress film. Specifically, a positive stress value corresponds to the tensile stress, and a negative stress value corresponds to the compressive stress. The part "A" of FIG. 18 corresponds to the stress (film stress) of the silicon nitride film deposited as the tensile stress film over the semiconductor substrate (semiconductor wafer), and the part "B" of FIG. 18 corresponds to the stress (film stress) of the silicon nitride film after applying hydrogen plasma processing to the silicon nitride film "A". The part "C" of FIG. 18 corresponds to the stress (film stress) of the silicon nitride film deposited as the compressive stress film over the semiconductor substrate (semiconductor wafer), and the part "D" of FIG. 18 corresponds to the stress (film stress) of the silicon nitride film after applying hydrogen plasma processing to the silicon nitride film "C".

As can be seen from the comparison between the part "A" and the part "B" in FIG. 18, when the plasma processing (hydrogen plasma processing in FIG. 18) is applied to the silicon nitride film deposited as the tensile stress film, the tensile stress is relieved (decreased) after the plasma processing (as indicated by the part "B" in FIG. 18) as compared to before the plasma processing (as indicated by the part "A" in FIG. 18). As can be seen from the comparison between the part "C" and the part "D" in FIG. 18, when the plasma processing (hydrogen plasma processing in FIG. 18) is applied to the silicon nitride film deposited as the compressive stress film, the compressive stress is relieved (decreased) after the plasma processing (as indicated by the part "D" in FIG. 18) as compared to before the plasma processing (as indicated by the part "C" in FIG. 18). That is, the compressive or tensile stress film is subjected to the plasma processing, and thereby has its stress relieved (decreased). As can be seen from the comparison between the parts "A" and "B" in FIG. 18, and between the parts "C" and "D" in FIG. 18, the tensile stress film has the larger effect of relieving (decreasing) the stress by the plasma processing than that of the compressive stress film.

Figure 19:
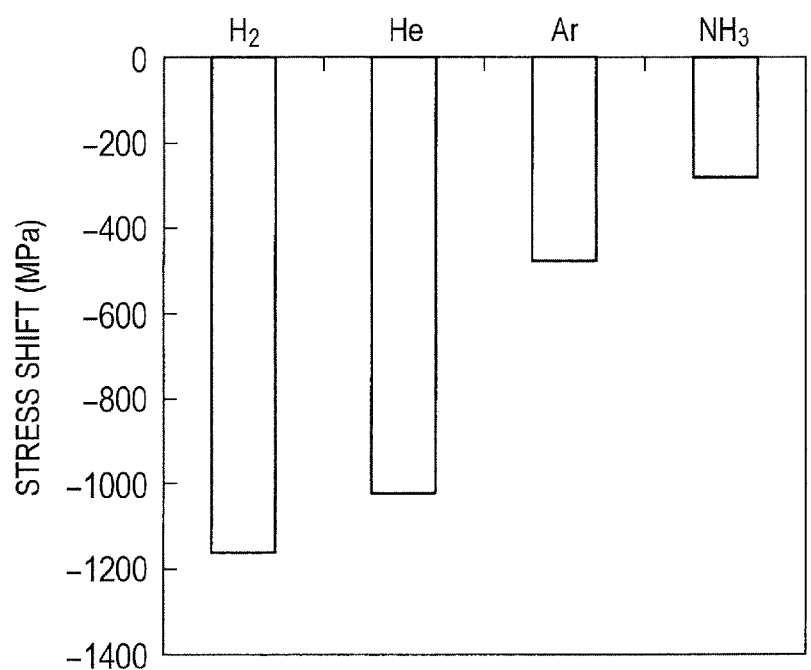
FIG. 19 is a graph showing the amount of change in stress of a silicon nitride film (stress shift) with a tensile stress formed over the main surface of the semiconductor substrate upon applying plasma processing using various kinds of gases.

FIG. 19 shows a graph of changes in stress (stress shifts) of the tensile-stress silicon nitride films formed over the main surface of the semiconductor substrate (semiconductor wafer) when being subjected to various types of plasma processing using different kinds of gases. FIG. 19 respectively shows the case of the hydrogen processing (indicated by the reference character "$H_2$" in FIG. 19), the case of the helium plasma processing (indicated by the reference character "He" in FIG. 19), the case of the argon plasma processing (indicated by the reference character "Ar" in FIG. 19), and the case of the ammonia plasma processing (indicated by the reference character "$NH_3$" in FIG. 19). In FIG. 19, the vertical or "y" axis of the graph indicates a shift (change) of a stress of the silicon nitride film having the tensile stress after the plasma processing with reference to the stress of the silicon nitride film before the plasma processing. That is, the vertical axis in FIG. 19 corresponds to a value obtained by subtracting a stress value of the silicon nitride film before the plasma processing from that of the silicon nitride film after the plasma processing. Referring to FIG. 19, for example, in the case of the hydrogen plasma processing, the stress (tensile stress) of the silicon nitride film having the tensile stress before the plasma processing is about 1500 MPa. After the hydrogen plasma processing, the tensile stress is shifted toward the compression side by about 1200 MPa (note that the minus side in FIG. 19 indicates the compression side). As a result, the tensile stress of the silicon nitride film after the hydrogen plasma processing is about 300 MPa. Referring also to FIG. 19, for example, in the case of the ammonia plasma processing, the stress (tensile stress) of the silicon nitride film having the tensile stress before the plasma processing is about 1500 MPa. After the ammonia plasma processing, the tensile stress is shifted toward the compression side by about 300 MPa (note that the minus side in FIG. 19 indicates the compression side). As a result, the tensile stress of the silicon nitride film after the ammonia plasma processing is about 1200 MPa.

As shown in FIG. 19, in any one of the hydrogen plasma processing, the helium plasma processing, the argon plasma processing, and the ammonia plasma processing, the tensile stress of the silicon nitride film can be relieved (decreased). The effect (effect of relieving the stress) is larger in the ammonia plasma processing, the argon plasma processing, the helium plasma processing, and the hydrogen plasma processing in that order. Thus, the use of the hydrogen plasma processing as the plasma processing in step S6 can most effectively relieve (decrease) the tensile stress of the silicon nitride film 5 in the pMIS formation region 1B.

Figure 20:
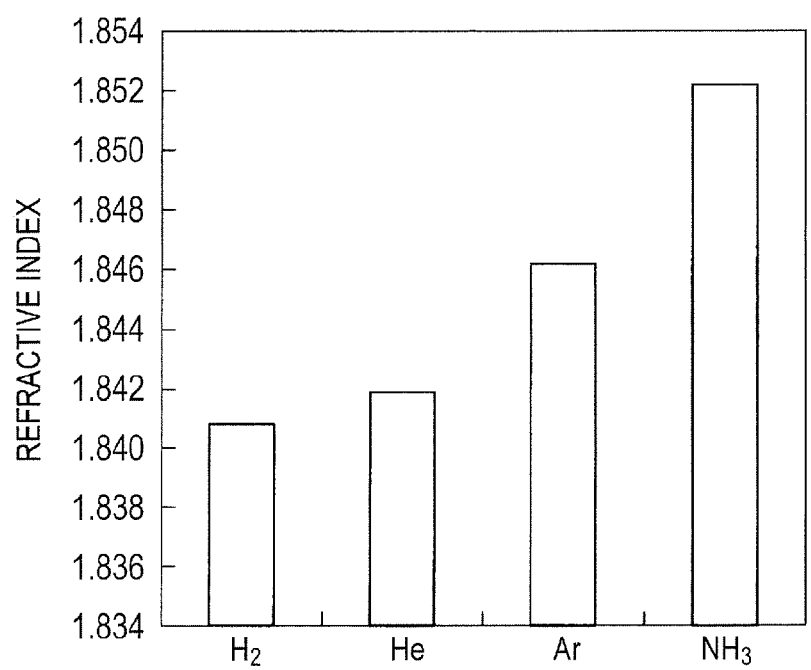
FIG. 20 is a graph showing a refractive index of the silicon nitride film with the tensile stress formed over the main surface of the semiconductor substrate after the plasma processing applied to the silicon nitride film using various kinds of gases.

FIG. 20 shows a graph of refractive indexes of the tensile-stress silicon nitride films formed over the main surface of the semiconductor substrate (semiconductor wafer) when being subjected to various types of plasma processing using different kinds of gases. FIG. 20 respectively shows the case of the hydrogen processing (indicated by the reference character "$H_2$" in FIG. 20), the case of the helium plasma processing (indicated by the reference character "He" in FIG. 20), the case of the argon plasma processing (indicated by the reference character "Ar" in FIG. 20), and the case of the ammonia plasma processing (indicated by the reference character "$NH_3$" in FIG. 20). In the case shown in FIG. 20, a refractive index of the silicon nitride film before the plasma processing is about 1.857.

As shown in FIG. 20, the refractive index of the silicon nitride film after the irradiation of the plasma becomes smaller in the ammonia plasma processing, the argon plasma processing, the helium plasma processing, and the hydrogen plasma processing in that order. A difference in refractive index reflects a difference in density between the silicon nitride films. That is, the reason why the refractive index of the silicon nitride film after the irradiation of the plasma becomes smaller in the ammonia plasma processing, the argon plasma processing, the helium plasma processing, and the hydrogen plasma processing in that order is as follows. The density of the silicon nitride film after the irradiation of the plasma becomes smaller in the ammonia plasma processing, the argon plasma processing, the helium plasma processing, and the hydrogen plasma processing in that order. The hydrogen contained in the silicon nitride film is detached by the plasma processing, so that the silicon nitride film contracts to decrease the density of the silicon nitride film. The effect becomes larger in the ammonia plasma processing, the argon plasma processing, the helium plasma processing, and the hydrogen plasma processing in that order.

As can be seen from the comparison between FIG. 19 and FIG. 20, a refractive index of the silicon nitride film after the irradiation of the plasma is correlated with the amount of relieving (amount of decreasing) of the stress of the silicon nitride film by the irradiation of the plasma. Specifically, the smaller the refractive index of the silicon nitride film after the irradiation of the plasma, the larger the amount of relieving (amount of decreasing) the stress of the silicon nitride film due to the irradiation of the plasma. In the case of performing the hydrogen plasma processing, the refractive index of the silicon nitride film after the irradiation of the plasma becomes smallest, and the amount of relieving (amount of decreasing) the stress of the silicon nitride film due to the irradiation of the plasma becomes largest.

In the first embodiment, the UV irradiation process is applied in step S2 to the tensile-stress silicon nitride film 5 deposited in step S1. The UV irradiation process includes the effect of increasing the tensile stress of the silicon nitride film 5, and the effect of decreasing the hydrogen content (hydrogen concentration) of the silicon nitride film 5. As described above, the UV irradiation process is performed on the silicon nitride film to detach hydrogen from the silicon nitride film, so that the silicon nitride film contracts and a bond angle between the Si (silicon) and N (nitrogen) of the silicon nitride film is changed to thereby increase the tensile stress of the silicon nitride film. The UV irradiation process is applied to the silicon nitride film to detach the hydrogen from the silicon nitride film, which reduces the hydrogen content of the silicon nitride film.

The tensile stress of the silicon nitride film 5 is increased by the UV irradiation in step S2, whereby the tensile stress of the silicon nitride film 5 in the nMIS formation 1A (that is, the part of the silicon nitride film 5 covering the n-channel MISFETQn) can be increased to thereby improve the characteristics (on-state current) of the n-channel MISFETQn. Thus, the performance of the semiconductor device with the CMISFET can be improved. The hydrogen content of the silicon nitride film 5 is decreased by the UV irradiation in step S2, which improves the characteristics of the p-channel MISFETQp. This will be described below.

When the hydrogen content of the silicon nitride film 5 is high, the negative bias temperature instability (NBTI) of the p-channel MISFETQp tends to become large. In order to prevent this state, it is effective to decrease the hydrogen content of the silicon nitride film 5 in the pMIS formation region 1B (that is, the part of the silicon nitride film 5 covering the p-channel MISFETQp). However, when the hydrogen content of the silicon nitride film 5 in the nMIS formation region 1A (that is, the part of the silicon nitride film 5 covering the n-channel MISFETQn) is high, hydrogen moves therefrom to the silicon nitride film 5 in the pMIS formation region 1B to increase the NBTI of the p-channel MISFETQp. It is preferable to decrease the hydrogen content of the silicon nitride film 5 not only in the pMIS formation region 1B, but also in the nMIS formation region 1A.

In the first embodiment, the UV irradiation process in step S2 is applied to both the nMIS formation region 1A and the pMIS formation region 1B (specifically, the entire surfaces of the silicon nitride films 5 covering the nMIS formation region 1A and the pMIS formation region 1B) to thereby decrease the hydrogen content of the silicon nitride film 5 in each of the nMIS formation region 1A and the pMIS formation region 1B. Thus, the hydrogen content of the silicon nitride film 5 in the pMIS formation region 1B is decreased, which can prevent the hydrogen element from moving from the silicon nitride film 5 in the nMIS formation region 1A to the silicon nitride film 5 in the pMIS formation region 1B, thus reducing the NBTI of the p-channel MISFETQp. As a result, the characteristics of the p-channel MISFETQp can be improved to thereby improve the performance of the semiconductor device with the CMISFET. The UV irradiation process in step S2 can decrease the hydrogen content of the silicon nitride film 5 in each of the nMIS formation region 1A and the pMIS formation region 1B. Specifically, the hydrogen content of the silicon nitride film 5 after being decreased is preferably $3 \times 10^{21}/cm^3$ (that is, $3 \times 10^{21}$ atom/$cm^3$) or less. This arrangement can surely provide the above-mentioned effects. The hydrogen content of the silicon nitride film can be represented by a hydrogen atom content of the silicon nitride film per unit volume.

In the first embodiment, in step S2, the UV irradiation process is performed on the silicon nitride films 5 in both the nMIS formation region 1A and the pMIS formation region 1B to thereby decrease the hydrogen content of the silicon nitride film 5 in each of the nMIS formation region 1A and the pMIS formation region 1B. As a result, the silicon nitride film 5 in the nMIS formation region 1A has the equal (same) hydrogen content to that of the silicon nitride film 5 in the pMIS formation region 1B. In the semiconductor device manufactured, the hydrogen content of the silicon nitride film 5 in the nMIS formation region 1A (that is, the part of the silicon nitride film 5 covering the n-channel MISFETQn) is equal to (the same as) that of the silicon nitride film 5 in the pMIS formation region 1B (that is, the part of the silicon nitride film 5 covering the p-channel MISFETQp). The term "equal" as used herein means a margin or an allowance of plus or minus about 10%. In the semiconductor device manufactured, the hydrogen content of the silicon nitride film 5 in each of the nMIS formation region 1A and the pMIS formation region 1B is preferably $3 \times 10^{21}/cm^3$ or less. Thus, the thus-manufactured semiconductor device can improve the characteristics of the p-channel MISFETQp (specifically, reduce the NBTI) to thereby improve the performance of the semiconductor device.

As mentioned above, in the manufactured semiconductor device, the tensile stress of the silicon nitride film 5 in the nMIS formation region 1A is at least twice as large as that of the silicon nitride film 5 in the pMIS formation region 1B. This arrangement can suppress or prevent the reduction in characteristics (for example, on-state current) of the p-channel MISFETQp to surely improve the characteristics of the n-channel MISFETQn (for example, on-state current), thus improving the performance of the semiconductor device with the CMISFT. In order to effectively improve the characteristics (for example, on-state current) of the n-channel MISFETQn in the manufactured semiconductor device, the tensile stress of the silicon nitride film 5 in the nMIS formation region 1A (that is, the part of the silicon nitride film 5 covering the n-channel MISFETQn) is more preferably 1.4 GPa or more (note that the absolute value of the stress is 1.4 GPa or more).

In this embodiment, the silicon nitride film 5 having the tensile stress is deposited in step S1, and then subjected to the UV irradiation process in step S2. The mask layer 6a is formed in step S5 to cover the nMIS formation region 1A and to expose the pMIS formation region 1B. Then, the plasma processing is performed in step S6. The order of these steps is very important, which will be described below.

Figure 21:
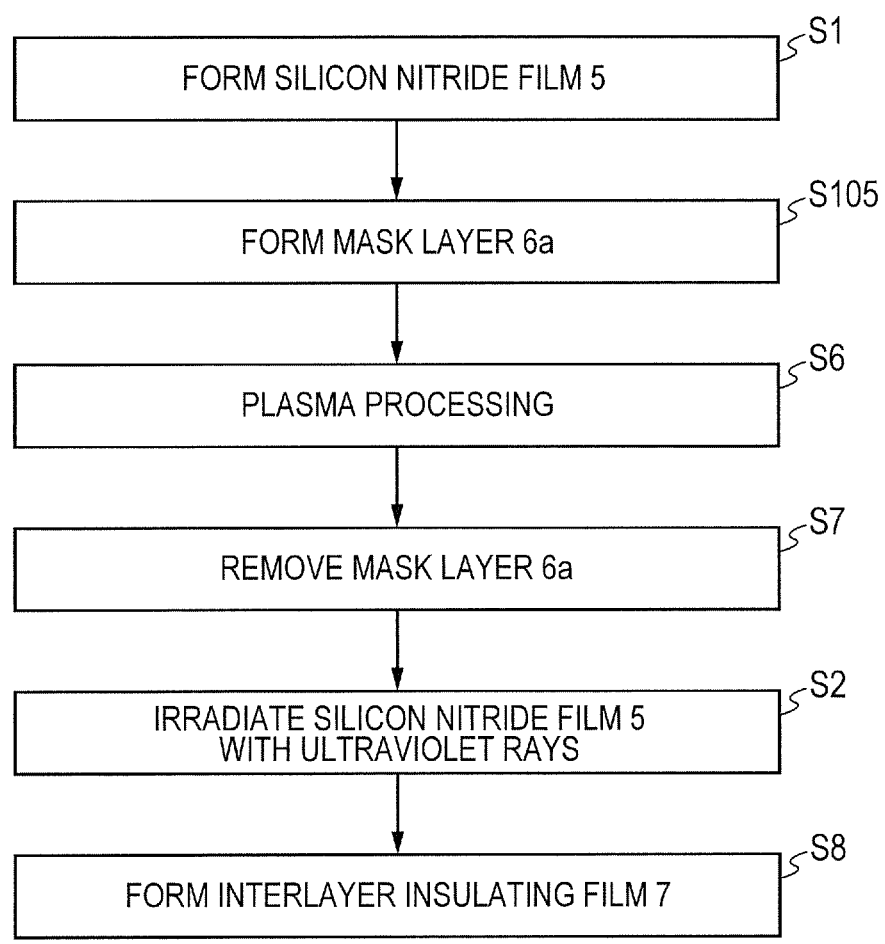
FIG. 21 is a manufacturing process flowchart showing a manufacturing process of a semiconductor device in a second comparative example.

FIG. 21 shows a manufacturing process flowchart of a manufacturing process of a semiconductor device in a second comparative example, and corresponds to FIG. 7 described in this embodiment. The step S105 shown in FIG. 21 (formation step of the mask layer 6a) is actually comprised of the above steps S3, S4, and S5. For simplifying the drawings and easy understanding, the combination of the above steps S3, S4, and S5 is hereinafter referred to as the step S105 shown in FIG. 21.

In the second comparative example shown in FIG. 21, the silicon nitride film 5 having the tensile stress is deposited by the plasma CVD method in step S1, and then the mask layer 6a is formed in step S105 to cover the nMIS formation region 1A and to expose the pMIS formation region 1B. In this state, the plasma processing is performed in step S6, so that the tensile stress of the silicon nitride film 5 in the pMIS formation region 1B can be relieved. In the second comparative example shown in FIG. 21, after the plasma processing in step S6, the mask layer 6a is removed in step S7, and then the UV irradiation process is performed on the silicon nitride film 5 in step S2. The UV irradiation process for the silicon nitride film 5 in step S2 is performed on the silicon nitride films 5 in both the nMIS formation region 1A and the pMIS formation region 1B, and thus will increase the tensile stress of the silicon nitride films 5 in both the nMIS formation region 1A and the pMIS formation region 1B. As a result, the tensile stress of the silicon nitride film 5 in the nMIS formation region 1A is substantially the same as that in the pMIS formation region 1B. This acts as follows. The tensile stress of the silicon nitride film 5 in the nMIS formation region 1A can improve the characteristics (for example, on-state current) of the n-channel MISFETQn, while the tensile stress of the silicon nitride film 5 in the pMIS formation region 1B reduces the characteristics (for example, on-state current) of the p-channel MISFETQp.

In the second comparative example shown in FIG. 21, when the UV irradiation process in step S2 is performed only on the nMIS formation region 1A and not the pMIS formation region 1B, the tensile stress of the silicon nitride film 5 only in the nMIS formation region 1A is possibly increased by the UV irradiation process in step S2. In this case, however, the silicon nitride film 5 in the nMIS formation region 1A decreases the hydrogen content by the UV irradiation process. Although the UV irradiation process is not performed on the silicon nitride film 5 in the pMIS formation region 1B, the hydrogen content of the silicon nitride film 5 in the pMIS formation region 1B cannot be reduced and would reduce the characteristics of the p-channel MISFETQp (for example, would increase the NBTI).

That is, in the second comparative example shown in FIG. 21, when the plasma processing is performed in advance and then the UV irradiation process is performed, the large tensile stress of the silicon nitride film 5 in the nMIS formation region 1A and the small tensile stress of the silicon nitride film 5 in the pMIS formation region 1B cannot be obtained. Alternatively, even if the above state can be obtained, the hydrogen content of the silicon nitride film 5 in the pMIS formation region 1B cannot be decreased.

In the second comparative example shown in FIG. 21, the plasma processing for the silicon nitride film 5 in step S6 is omitted and the UV irradiation process is performed only in the nMIS formation region 1A and not in the pMIS formation region 1B in step S2. In this case, the tensile stress of the silicon nitride film 5 in the nMIS formation region 1A can be increased by the UV irradiation process. But since the UV irradiation process is not performed on the silicon nitride film 5 in the pMIS formation region 1B, the hydrogen content of the silicon nitride film 5 in the pMIS formation region 1B cannot be decreased, and the characteristics of the p-channel MISFETQp would be reduced (for example, the NBTI would be increased).

In the second comparative example shown in FIG. 21, the plasma processing is performed on the silicon nitride film 5 in step S6, and the UV irradiation process in step S2 is omitted. In this case, the tensile stress of the silicon nitride film 5 in the pMIS formation region 1B can be decreased by the plasma processing. But, since the UV irradiation process is not performed on the silicon nitride film 5 in the nMIS formation region 1A, the tensile stress of the silicon nitride film 5 in the nMIS formation region 1A cannot be increased to a very large level. Thus, the effect of improving the characteristics MISFETQn (for example, on-state current) of the n-channel due to the tensile stress of the silicon nitride film 5 in the nMIS formation region 1A is reduced. Since the UV irradiation process is not performed, the hydrogen content of the silicon nitride film 5 cannot be decreased, which will reduce the characteristics of the p-channel MISFETQp (for example, increase the NBTI).

In contrast, in the first embodiment, the silicon nitride film 5 is deposited in step S1, and then subjected to the UV irradiation process in the step S2. The mask layer 6a is formed in step S5 to cover the nMIS formation region 1A and to expose the pMIS formation region 1B. Then, the plasma processing is performed in step S6. That is, in this embodiment, the silicon nitride films 5 in both the nMIS formation region 1A and the pMIS formation region 1B are subjected to the UV irradiation process in step S2 in advance, and then the silicon nitride film 5 in the pMIS formation region 1B is subjected to the plasma processing in step S6. In step S2, the UV irradiation process is performed on the silicon nitride films 5 in both the nMIS formation region 1A and the pMIS formation region 1B, which can increase the tensile stress of the silicon nitride film 5 in each of the nMIS formation region 1A and the pMIS formation region 1B, while reducing the hydrogen content of the silicon nitride film 5 in each of the nMIS formation region 1A and the pMIS formation region 1B. Thereafter, the plasma processing is performed on the silicon nitride film 5 in the pMIS formation region 1B in step S6 while the silicon nitride film 5 in the nMIS formation region 1A is covered with the mask layer 6a and the silicon nitride film 5 in the pMIS formation region 1B is exposed. As a result, the tensile stress of the silicon nitride film 5 in the pMIS formation region 1B can be relieved (decreased) while maintaining the tensile stress of the silicon nitride film 5 in the nMIS formation region 1A. This can achieve the large tensile stress of the silicon nitride film 5 in the nMIS formation region 1A, the small tensile stress of the silicon nitride film 5 in the pMIS formation region 1B, and the small hydrogen content of the silicon nitride film 5 in both the nMIS formation region 1A and the pMIS formation region 1B. Thus, the small tensile stress of the silicon nitride film 5 in the pMIS formation region 1B can suppress or prevent the reduction in characteristics (for example, on-state current) of the p-channel MISFETQp. And, the large tensile stress of the silicon nitride film 5 in the nMIS formation region 1A can improve the characteristics (on-state current) of the n-channel MISFETQn. The hydrogen content of the silicon nitride film 5 in each of the nMIS formation region 1A and the pMIS formation region 1B is decreased to improve the characteristics of the p-channel MISFETQp (for example, to decrease the NBTI). Thus, the performance of the semiconductor device with the n-channel MISFET and the p-channel MISFET (that is, the semiconductor device with the CMISFET) can be improved.

In this way, in this embodiment, the silicon nitride film 5 is subjected to the UV irradiation process and the plasma processing, the order of which can be devised to surely improve the performance (characteristics) of the semiconductor device.

<Modified Examples of Embodiments>

Figure 22:
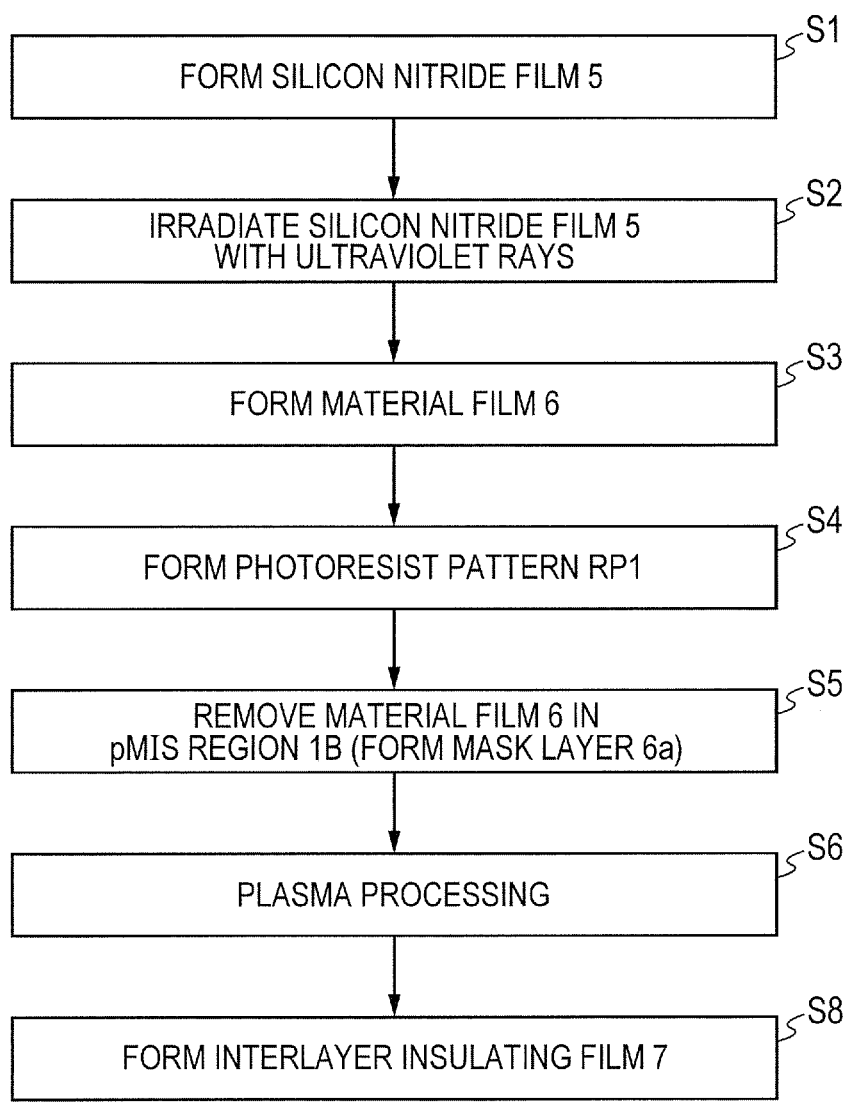
FIG. 22 is a manufacturing process flowchart showing parts of a manufacturing process of the semiconductor device according to a modified example of the one embodiment of the invention.
Figure 23:
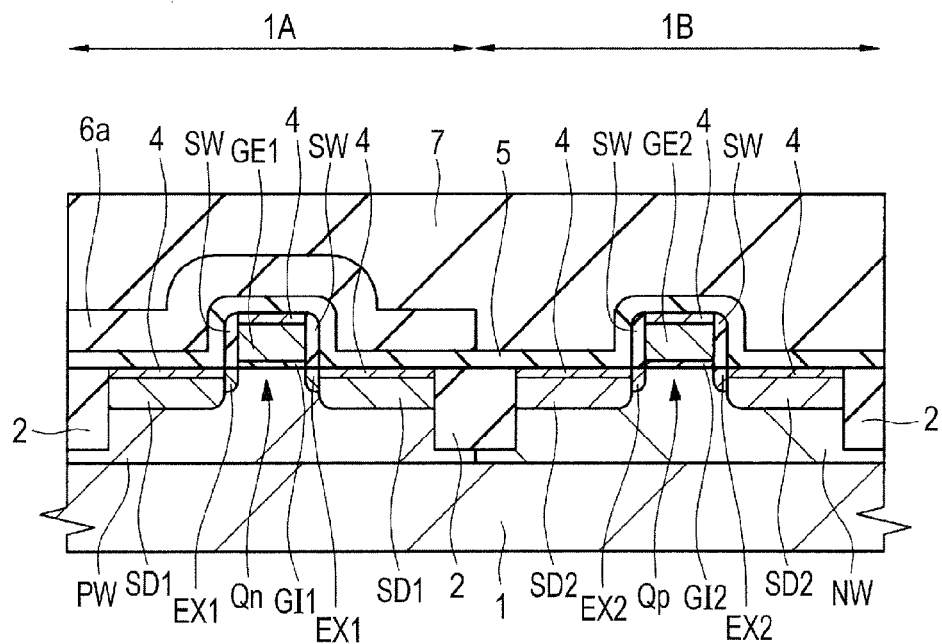
FIG. 23 is a cross-sectional view of a main part of the manufacturing process of the semiconductor device in the modified example of the one embodiment of the invention.
Figure 24:
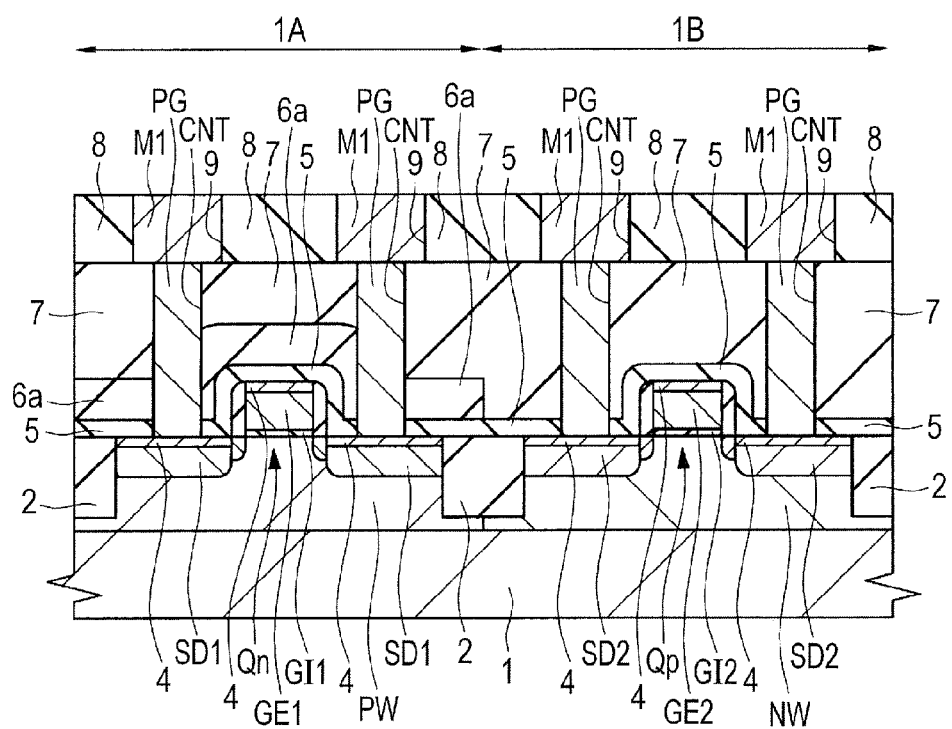
FIG. 24 is a cross-sectional view of a main part of another manufacturing step of the semiconductor device, following the step shown in FIG. 23.

In the steps shown in FIGS. 1 to 15, after the plasma processing in step S6, the mask layer 6a is removed in step S7, and the interlayer insulating film 7 is formed. In a modified example of this embodiment, after the plasma processing in step S6, the interlayer insulating film 7 is formed without the step of removing the mask layer 6a in step S7. This modified example will be described below with reference to FIGS. 22 to 24. FIG. 22 is a manufacturing process flowchart showing a part of a manufacturing process of a semiconductor device in the modified example of this embodiment, and corresponds to FIG. 7. FIGS. 23 and 24 are cross-sectional views of main parts of manufacturing steps of the semiconductor device in the modified example of this embodiment.

As shown in FIGS. 1 to 6 and FIGS. 8 to 11, after the plasma processing in step S6, in the modified example, the interlayer insulating film 7 is formed in step S8 without removing the mask layer 6a in step S7 as shown in FIG. 23. In the case shown in FIG. 13, the interlayer insulating film 7 is formed directly over the silicon nitride film 5 in both the nMIS formation region 1A and the pMIS formation region 1B. However, in the case shown in FIG. 23 (modified example), the interlayer insulating film 7 is formed with the mask layer 6a remaining in the nMIS formation region 1A, so that the interlayer insulating film 7 is formed over the mask layer 6a in the nMIS formation region 1A, and also over the silicon nitride film 5 in the pMIS formation region 1B.

After forming the interlayer insulating film 7, the upper surface of the interlayer insulating film 7 is planarized by polishing the surface of the interlayer insulating film 7 by the CMP method.

Then, the interlayer insulating film 7, the mask layer 6a, and the silicon nitride film 5 are dry-etched using a photoresist pattern (not shown) formed over the interlayer insulating film 7 as an etching mask to thereby form contact holes CNT in the interlayer insulating film 7, the mask layer 6a, and the silicon nitride film 5 as shown in FIG. 24. In the nMIS formation region 1A, the contact hole CNT is formed to penetrate the laminated film (laminated insulating film) comprised of the interlayer insulating film 7, the mask layer 6a, and the silicon nitride film 5. In the pMIS formation region 1B, the contact hole CNT is formed to penetrate the laminated film (laminated insulating film) comprised of the interlayer insulating film 7, and the silicon nitride film 5.

In order to form the contact holes CNT, first, the interlayer insulating film 7 and the mask layer 6a are dry-etched using the silicon nitride film 5 as an etching stopper film on conditions in which the interlayer insulating film 7 and the mask layer 6a are etched more than the silicon nitride film 5, whereby the contact holes CNT are formed through the interlayer insulating film 7 and the mask layer 6a in the nMIS formation region 1A, and through the interlayer insulating film 7 in the pMIS formation region 1B. Then, the part of the silicon nitride film 5 located at the bottom of the contact hole CNT is dry-etched and removed on the conditions in which the silicon nitride film 5 is etched more than the interlayer insulating film 7 and the mask layer 6a to thereby form the contact hole CNT as a through hole. The metal silicide layer 4 over the $n^+$-type semiconductor region SD1 is exposed at the bottom of the contact hole CNT formed over the $n^+$-type semiconductor region SD1, and the metal silicide layer 4 over the $p^+$-type semiconductor region SD2 is exposed at the bottom of the contact hole CNT formed over the $p^+$-type semiconductor region SD2. The silicon nitride film 5 serves as the etching stopper film upon forming the contact holes CNT, which can suppress or prevent the excessive digging of the contact hole CNT or the damage on the substrate.

The following steps after the formation step of the contact hole CNT are basically the same as those described with reference to FIGS. 14 and 15. That is, as shown in FIG. 24, the conductive plug PG is formed in each contact hole CNT, the insulating film (interlayer insulating film) 8 for formation of wiring is formed over the interlayer insulating film 7 with the plug PG embedded therein. Each wiring trench 9 is formed in the insulating film 8, and the wiring M1 is formed in the wiring trench 9.

In the modified example shown in FIGS. 22 to 24, the mask layer 6a also remains in the manufactured semiconductor device because the removal process of the mask layer 6a in step S7 is not performed. The mask layer 6a needs to have insulating properties, and thus the mask layer 6a and the material film 6 of which the mask layer 6a is formed are insulating films. In order to easily form the contact hole CNT, the mask layer 6a is more preferably made of the same material as that of the interlayer insulating film 7. Thus, a silicon oxide film can be suitably used as the mask layer 6 (namely, the material film 6).

In the modified example shown in FIGS. 22 to 24, the use of the silicon oxide film as the mask layer 6a can provide the following advantages to be described with reference to FIG. 25, in addition to the above effects of this embodiment.

Figure 25:
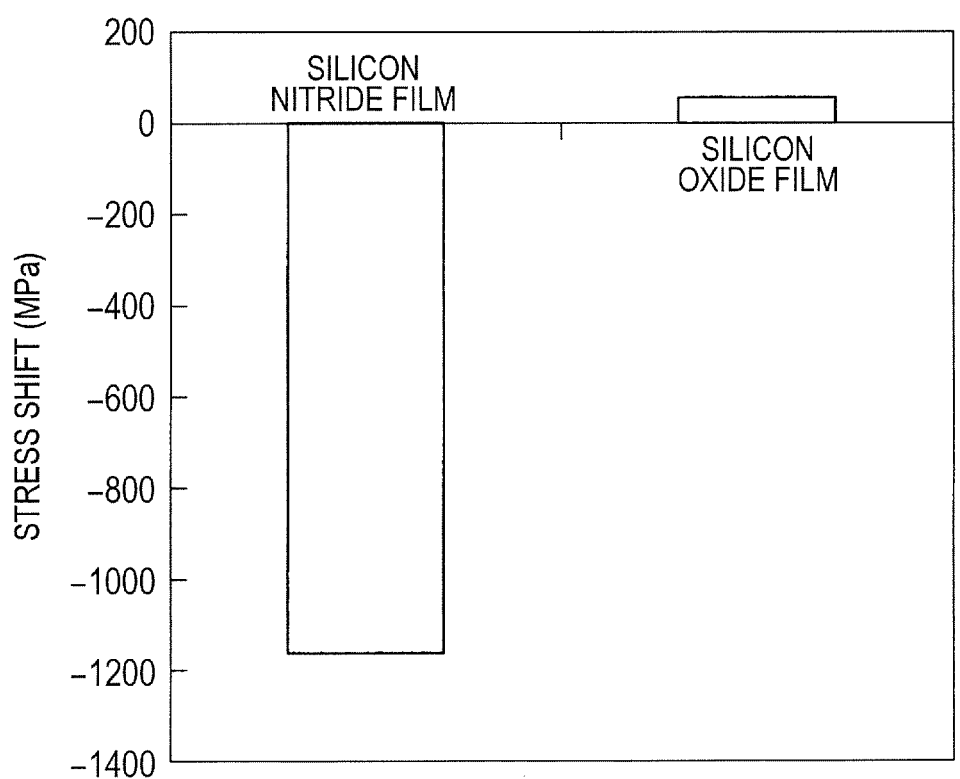
FIG. 25 is a graph showing the change in stress (stress shift) of a silicon film and a silicon oxide film formed over the main surface of the semiconductor substrate upon applying hydrogen plasma processing thereto.

FIG. 25 is a graph showing the amount of a change (stress shift) in stress of the silicon nitride film and the silicon oxide film formed over the main surface of the semiconductor substrate (semiconductor wafer) when performing the hydrogen plasma processing on the silicon nitride film and the silicon oxide film. In FIG. 25, the vertical ("y") axis of the graph indicates how much the stress is shifted (changed) by the hydrogen plasma processing with respect to the original stress of each of the silicon nitride film and the silicon oxide film before the plasma processing. That is, the vertical axis of FIG. 25 corresponds to a value obtained by subtracting a stress before the hydrogen plasma processing from another stress after the hydrogen plasma processing.

Referring to FIG. 25, in the case of the silicon nitride film, the stress (tensile stress) of the silicon nitride film before the plasma processing is about 1500 MPa. After the hydrogen plasma processing, the tensile stress is shifted toward the compression side by about 1200 MPa (note that the minus (i.e., negative) side in FIG. 25 indicates the compression side). As a result, the tensile stress of the silicon nitride film after the hydrogen plasma processing is about 300 MPa. In the case of the silicon oxide film, the stress before the plasma processing is substantially zero. However, the stress after the plasma processing is shifted toward the tensile side by several tens of MPa (note that FIG. 25 shows the tensile side) to become the several tens of MPa.

That is, the stress of the silicon nitride film can be shifted toward the compression side by the plasma processing (specifically, hydrogen plasma processing) (that is, the tensile stress is relieved). In the case of the silicon oxide film, the silicon oxide film can serve as the tensile stress film.

Thus, the plasma processing is performed in step S6 such that the mask layer 6a is exposed in the nMIS formation region 1A and the silicon nitride film 5 is exposed in the pMIS formation region 1B, so that the mask layer 6a in the nMIS formation region 1A and the silicon nitride film 5 in the pMIS formation region 1B are mainly subjected to plasma. When the mask layer 6a is formed of a silicon oxide film, the plasma processing in step S6 relieves (decreases) the tensile stress of the silicon nitride film 5 in the pMIS formation region 1B, and the mask layer 6a comprised of silicon oxide becomes the tensile stress film. In the modified example shown in FIGS. 22 to 24, since the mask layer 6a having the tensile stress remains in the nMIS formation region 1A, not only the tensile stress of the silicon nitride film 5 in the nMIS formation region 1A, but also the tensile stress of the mask layer 6a in the nMIS formation region 1A contributes to improvement of the characteristics (on-state current) of the n-channel MISFETQn, thereby further improving the characteristics (performance) of the semiconductor device.

Second Embodiment

Figure 26:
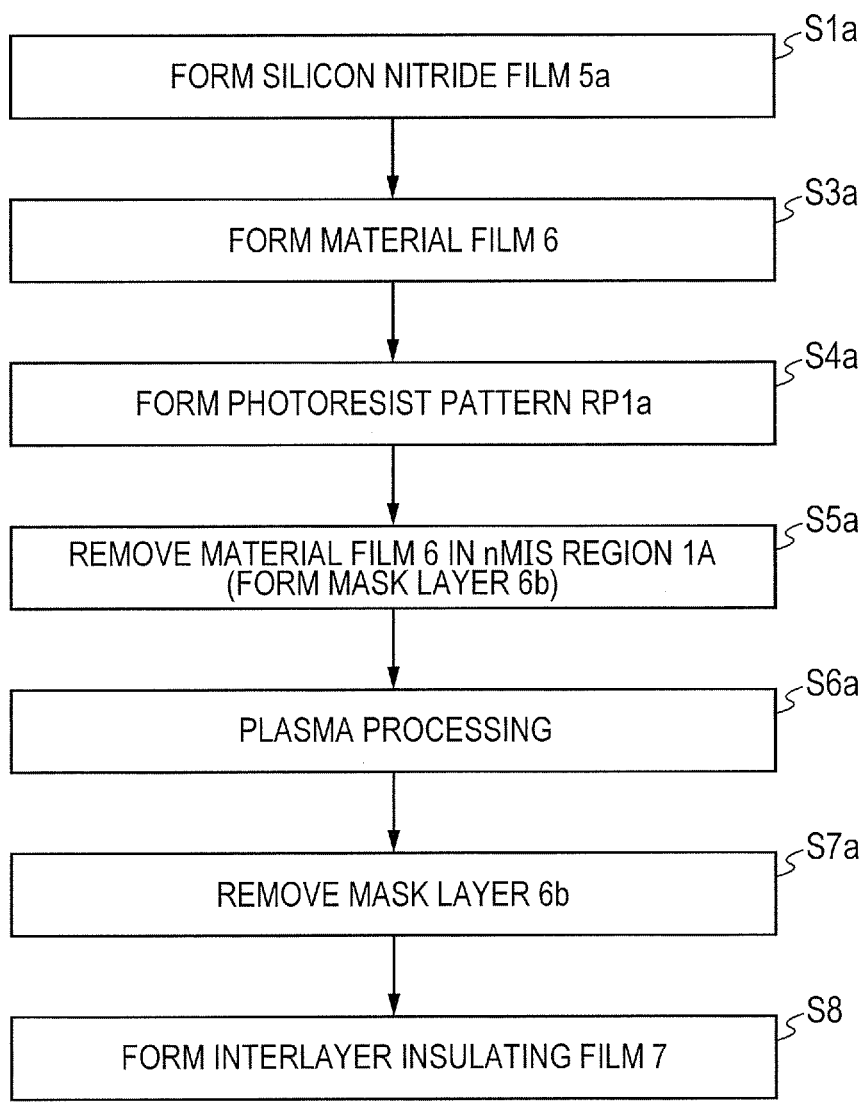
FIG. 26 is a manufacturing process flowchart showing parts of a manufacturing process of a semiconductor device according to another embodiment of the invention.

A manufacturing process of a semiconductor device according to this embodiment will be described below with reference to the accompanying drawings. FIG. 26 shows a manufacturing process flowchart of a part of a manufacturing step of the semiconductor device in this embodiment, and corresponds to FIG. 7 described above in the first embodiment. FIG. 26 shows the manufacturing process flowchart from the formation step of the silicon nitride film 5a after obtaining the structure of FIG. 6 until the formation step of the interlayer insulating film 7. FIGS. 27 to 33 are cross-sectional views of main parts of the semiconductor device in this embodiment, specifically, during the manufacturing process of the semiconductor device with the CMISFET.

The manufacturing steps of the semiconductor device in this embodiment are the same as those of the first embodiment directly before the step of forming the silicon nitride film 5 (that is, until the structure shown in FIG. 6 is obtained), and a description thereof will be omitted below.

In the first embodiment, the silicon nitride film 5 is formed as the tensile stress film.

Figure 27:
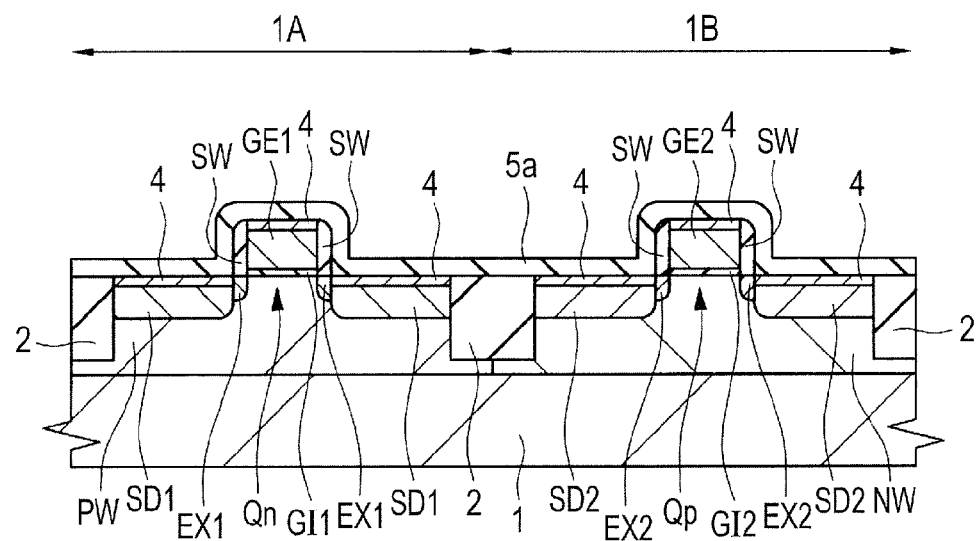
FIG. 27 is a cross-sectional view of a main part of a manufacturing step of the semiconductor device according to the another embodiment of the invention.

In this embodiment, however, after obtaining the structure shown in FIG. 6 in the same way as the first embodiment, not the silicon nitride film 5 as the tensile stress film, but a silicon nitride film 5a as the compressive stress film (insulating film for compression of stress) is formed (in step S1a shown in FIG. 26) as shown in FIG. 27.

Like the silicon nitride film 5, the silicon nitride film 5a is also formed over the entire main surface of the semiconductor substrate 1 including the nMIS formation region 1A and the pMIS formation region 1B. Thus, the silicon nitride film 5a is formed to cover the gate electrode GE1, the sidewall spacers SW, and the n$^+$-type semiconductor region SD1 in the nMIS formation region 1A, and also formed to cover the gate electrode GE2, the sidewall spacer SW, and the p$^+$-type semiconductor region SD2 in the pMIS formation region 1B. That is, the silicon nitride film 5a is formed over the main surface of the semiconductor substrate 1 including the metal silicide layer 4 to cover the gate electrodes GE1 and GE2, the sidewall spacer SW, the n$^+$-type semiconductor region SD1, and the p$^+$-type semiconductor region SD2. In other words, the silicon nitride film 5a is formed over the main surface of the semiconductor substrate 1 to cover the n-channel MISFETQn and the p-channel MISFETQp. In the nMIS formation region 1A, the n-channel MISFETQn is covered with the silicon nitride film 5a, and in the pMIS formation region 1B, the p-channel MISFETQ is covered with the silicon nitride film 5a.

The silicon nitride film 5a can be formed by the plasma CVD method. In step S1a, the silicon nitride film 5a is formed as a compressive stress film. Specifically, the compressive stress film can be formed by depositing a silicon nitride film (silicon nitride film 5a) by the plasma CVD method while controlling deposition conditions (deposition temperature, the kind of deposition gas, the gas pressure, the high-frequency power or the like) upon the deposition. Thus, the silicon nitride film 5a directly after being deposited in step S1a can serve as the compressive stress film. For example, the silicon nitride film can be deposited by the plasma CVD at a temperature of about 350 to 500° C. using silane (SiH$_4$) gas, hydrogen (H$_2$) gas, nitrogen (N$_2$) gas, and ammonia (NH$_3$) gas to thereby form the silicon nitride film 5a as the compressive stress film. The thickness (film thickness) of the formed silicon nitride film 5a can be preferably in a range of 15 to 50 nm.

The UV irradiation process performed in step S2 in the first embodiment is not performed in this embodiment. This is because the silicon nitride film 5a as the compressive stress film is subjected to the UV irradiation process to decrease a compressive stress. Thus, the silicon nitride film 5a is preferably a film having a large compressive stress (film having a high tensile stress that can improve the characteristics (on-state current) of the p-channel MISFETQp) on the stage of deposition. The absolute value (absolute value of the stress) of the compressive stress of the silicon nitride film 5a deposited in step S1 is preferably 2 GPa or more.

Figure 28:
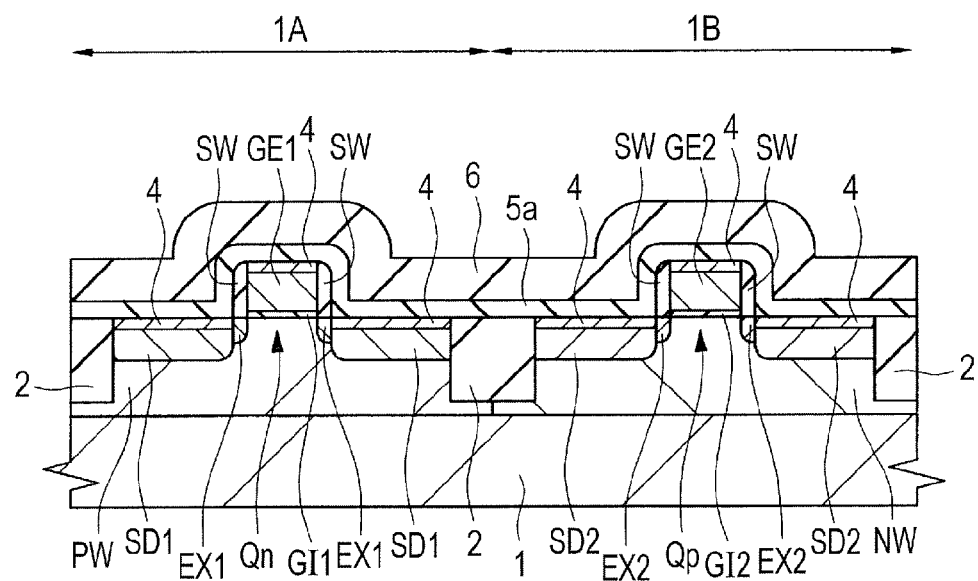
FIG. 28 is a cross-sectional view of a main part of another manufacturing step of the semiconductor device, following the step shown in FIG. 27.

After depositing the silicon nitride film 5a in step S1a, as shown in FIG. 28, the material film 6 for the mask layer is formed over the entire main surface of the semiconductor substrate 1 including the nMIS formation region 1A and the pMIS formation region 1B, that is, over the silicon nitride film 5a (in step S3a shown in FIG. 7). The material film 6 is made of the same as that in the first embodiment, and a description thereof will be omitted below.

Figure 29:
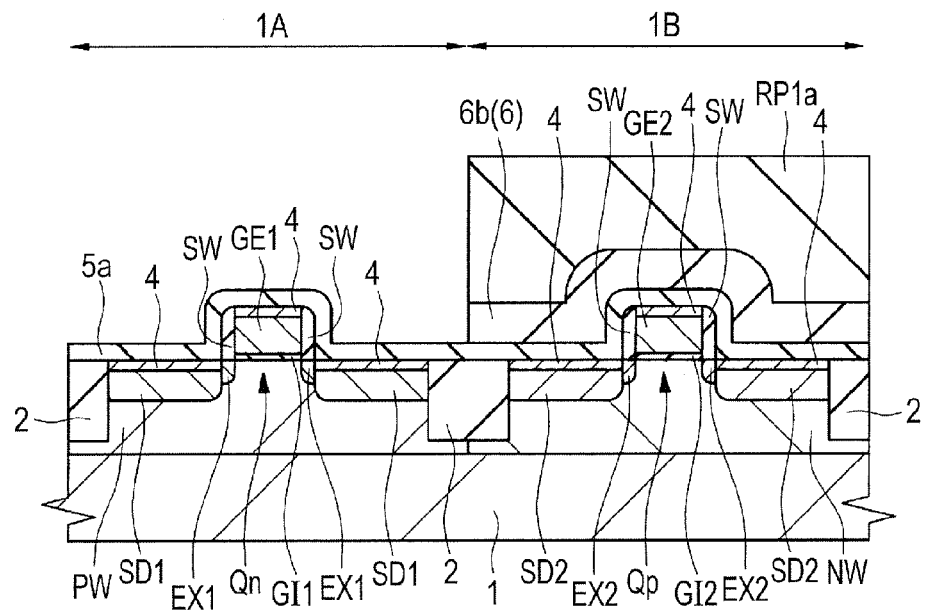
FIG. 29 is a cross-sectional view of a main part of another manufacturing step of the semiconductor device, following the step shown in FIG. 28.

Then, as shown in FIG. 29, a photoresist pattern RP1a is formed over the material film 6 by photolithography to cover the pMIS formation region 1B and to expose the nMIS formation region 1A (in step S4a shown in FIG. 26).

Then, the material film 6 in the nMIS formation region 1A is removed by etching using the photoresist pattern RP1a as an etching mask (in step S5a shown in FIG. 26). Thus, in the nMIS formation region 1A, the material film 6 is removed to expose the silicon nitride film 5a. In contrast, since in the pMIS formation region 1B, the photoresist pattern RP1a serves as the etching mask, the material film 6 remains without being removed to become the mask layer 6b, and the silicon nitride film 5a in the pMIS formation region 1B is not exposed. FIG. 29 shows the stage on which the etching process in step S5a is performed.

The mask layer 6b is comprised of the material film 6 remaining in the pMIS formation region 1B. The mask layer 6b is formed in the pMIS formation region 1B, and not in the nMIS formation region 1A. Thus, the mask layer 6b covers the silicon nitride film 5a in the pMIS formation region 1B and exposes the silicon nitride film 5 in the nMIS formation region 1A.

The etching process in step S5a in this embodiment differs from the etching process in step S5 in the first embodiment in the following point. That is, in the step S5 of the first embodiment, the material film 6 in the pMIS formation region 1B is removed to leave the material film 6 in the nMIS formation region 1A. In contrast, in the step S5a of this embodiment, the material film 6 in the nMIS formation region 1A is removed to leave the material film 6 in the pMIS formation region 1B. Except for the above point, the etching process in step S5a of this embodiment is basically the same as that in step S5 of the first embodiment.

Figure 30:
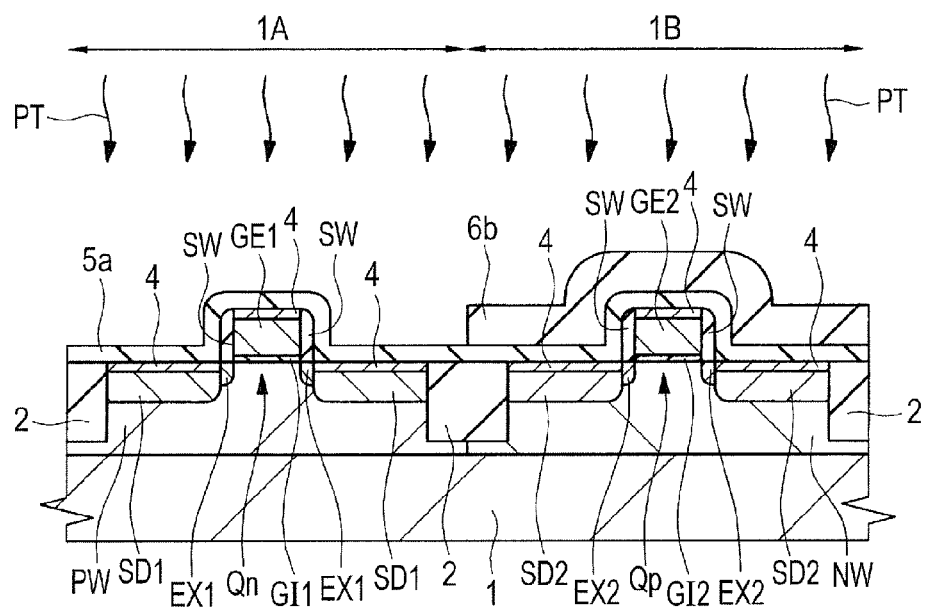
FIG. 30 is a cross-sectional view of a main part of another manufacturing step of the semiconductor device, following the step shown in FIG. 29.

After the etching process in step S5a, as shown in FIG. 30, the photoresist pattern RP1a is removed.

Then, the plasma processing is performed (in step S6a shown in FIG. 26). The plasma processing itself in step S6a is basically the same as that of the first embodiment in step S6. However, the plasma processing in step S6a differs from the plasma processing in the first embodiment in the following points. That is, in step S6 of the first embodiment, the plasma processing is performed while the silicon nitride film 5 in the nMIS formation region 1A is covered with the mask layer 6a and the silicon nitride film 5 in the pMIS formation region 1B is exposed without being covered with the mask layer 6a. In contrast, in step S6a of this embodiment, the plasma processing is performed while the silicon nitride film 5a in the pMIS formation region 1B is covered with the mask layer 6b and the silicon nitride film 5a in the nMIS formation region 1A is exposed without being covered with the mask layer 6b. The plasma processing is performed in step S6a while the silicon nitride film 5a is exposed in the nMIS formation region 1A without exposing the silicon nitride film 5a in the pMIS formation region 1B. Thus, the plasma processing in step S6a can be regarded as the step of performing the plasma processing on the silicon nitride film 5a in the nMIS formation region 1A (that is, the part of the silicon nitride film 5a covering the n-channel MISFETQn).

The processing in step S6a involves relieving (reducing) the compressive stress of the silicon nitride film 5a in the nMIS formation region 1A. As can be seen from FIG. 18 described above in the first embodiment, the plasma processing is applied not only to the silicon nitride film having the tensile stress, but also the silicon nitride film having the compressive stress, so that the stress of the film is relieved (reduced). The plasma processing in step S6 of the first embodiment relieves (reduces) the tensile stress of the silicon nitride film 5 in the pMIS formation region 1B. In contrast, the plasma processing in step S6a of this embodiment relieves (reduces) the compressive stress of the silicon nitride film 5a in the nMIS formation region 1A.

That is, the silicon nitride film 5a in the nMIS formation region 1A is exposed upon the plasma processing in step S6a, and thus is subjected to the plasma (in other words, the silicon nitride film 5a in the nMIS formation region 1A is exposed to the plasma), whereby the stress (here, the compressive stress) of the silicon nitride film 5a in the nMIS formation region 1A is relieved (reduced). In contrast, in the pMIS formation region 1B, the mask layer 6b is formed over the silicon nitride film 5a, and thus the silicon nitride film 5a is not exposed. Even if the plasma processing is performed in step S6a, because of mask layer 6b, the silicon nitride film 5a in the pMIS formation region 1B is not irradiated with plasma (in other words, the silicon nitride film 5a in the pMIS formation region 1B is not exposed to the plasma). Thus, even the performance of the plasma processing in step S6a hardly relieves (reduces) the stress (here, compressive stress) of the silicon nitride film 5a in the pMIS formation region 1B.

That is, when the silicon nitride film 5a as the compressive stress film is irradiated with the plasma, the compressive stress of the silicon nitride film 5a is relieved (reduced). This feature is used for the second embodiment. Then, the plasma processing in step S6a is performed while the silicon nitride film 5a is exposed in the nMIS formation region 1A and the silicon nitride film 5a is not exposed in the pMIS formation region 1B (with the silicon nitride film 5a in the pMIS formation region 1B covered with the mask layer 6b). As a result, the silicon nitride film 5a in the nMIS formation region 1A is irradiated with the plasma, whereas the silicon nitride film 5a in the pMIS formation region 1B is not irradiated with the plasma, which can relieve (reduce) the compressive stress of the silicon nitride film 5a in the nMIS formation region 1A, and can leave alone (does not relieve) the compressive stress of the silicon nitride film 5a in the pMIS formation region 1B.

Like the above process in step S6, the plasma processing in step S6a can also use hydrogen plasma processing, helium plasma processing, argon plasma processing, nitrogen plasma processing, or ammonia plasma processing. Alternatively, the plasma processing can use a mixed gas of two or more gases selected from the group consisting of hydrogen ($H_2$) gas, helium (He) gas, argon (Ar) gas, nitrogen ($N_2$) gas, and ammonia ($NH_3$) gas. Like the process in step S6 above, the plasma processing in step S6a is most preferably the hydrogen plasma processing. The hydrogen plasma processing is performed as the plasma processing in step S6a, so that the compressive stress of the silicon nitride film 5a in the nMIS formation region 1A can be most effectively relieved (reduced). Suitable other conditions for the plasma processing in step S6a (heating temperature of the semiconductor substrate, and the like) are the same as those in step S6.

Figure 31:
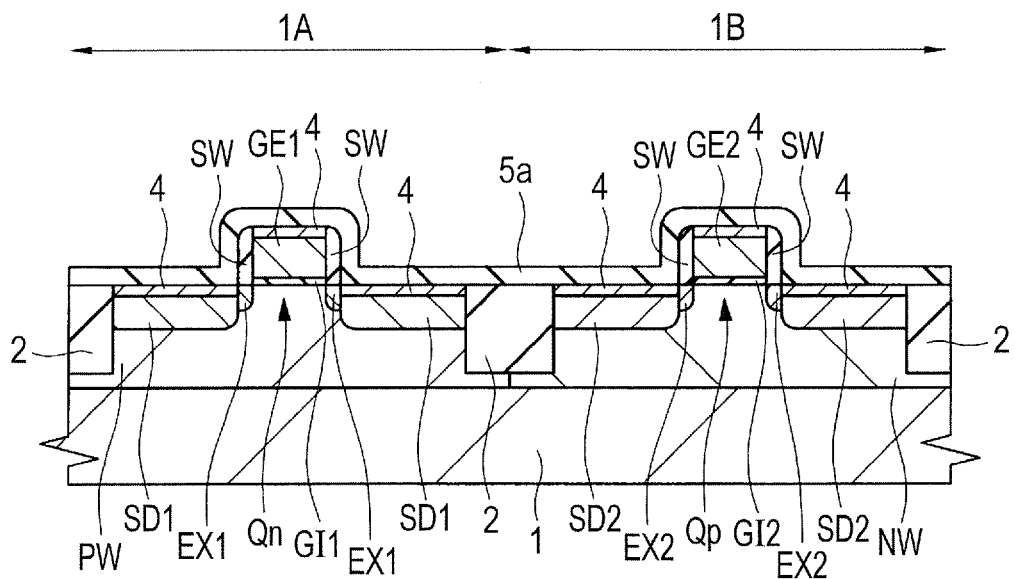
FIG. 31 is a cross-sectional view of a main part of another manufacturing step of the semiconductor device, following the step shown in FIG. 30.

After the plasma processing in step S6a, as shown in FIG. 31, the mask layer 6b is removed by etching or the like (in step S7a shown in FIG. 26).

Since the mask layer 6b is formed over the silicon nitride film 5a in the pMIS formation region 1B, the mask layer 6b in the pMIS formation region 1B is etched to be removed in step S7a. In contrast, the material film 6 in the nMIS formation region 1A is already removed in step S5a, and thus is exposed before and after step S7a. The mask layer 6b is removed in step S7a, so that the silicon nitride film 5a is exposed not only in the nMIS formation region 1A, but also in the pMIS formation region 1B. As a result, the silicon nitride film 5a is formed as the uppermost layer located at the main surface of the semiconductor substrate 1 in the nMIS formation region 1A and the pMIS formation region 1B. The etching conditions in step S7a can be basically the same as those in step S7 described above.

Figure 32:
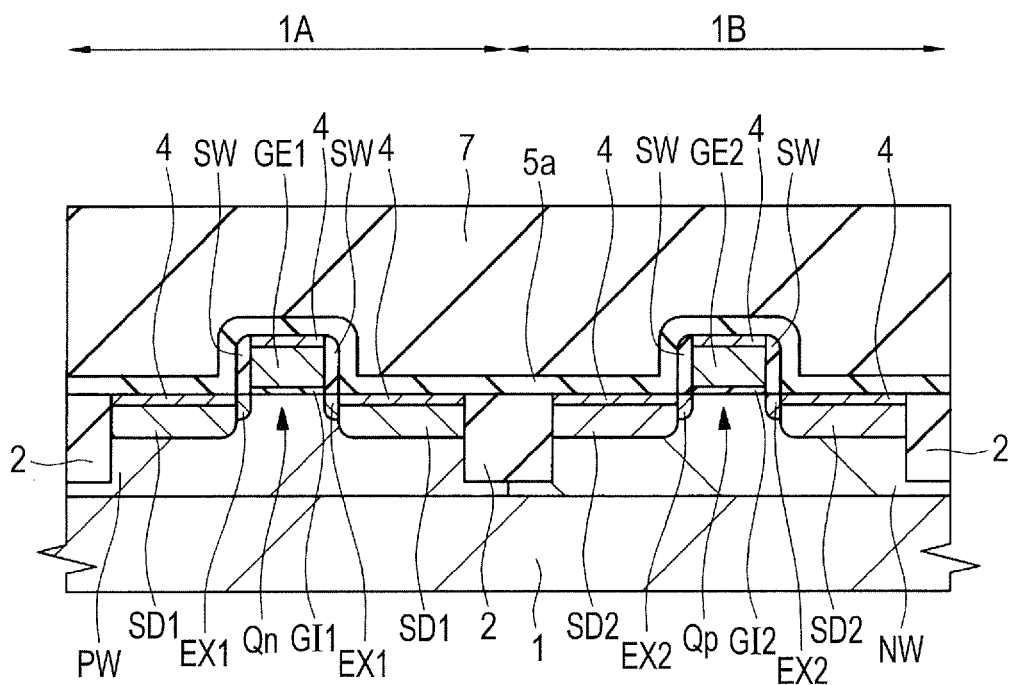
FIG. 32 is a cross-sectional view of a main part of another manufacturing step of the semiconductor device, following the step shown in FIG. 31.

Then, as shown in FIG. 32, the interlayer insulating film (insulating film) 7 is formed over the entire main surface of the semiconductor substrate 1 including the nMIS formation region 1A and the pMIS formation region 1B, that is, over the silicon nitride film 5a (in step S8 in FIG. 26). The interlayer insulating film 7 of this embodiment is basically the same as that of the first embodiment, and the description thereof will be omitted below. The following steps are basically the same as those of the first embodiment.

Figure 33:
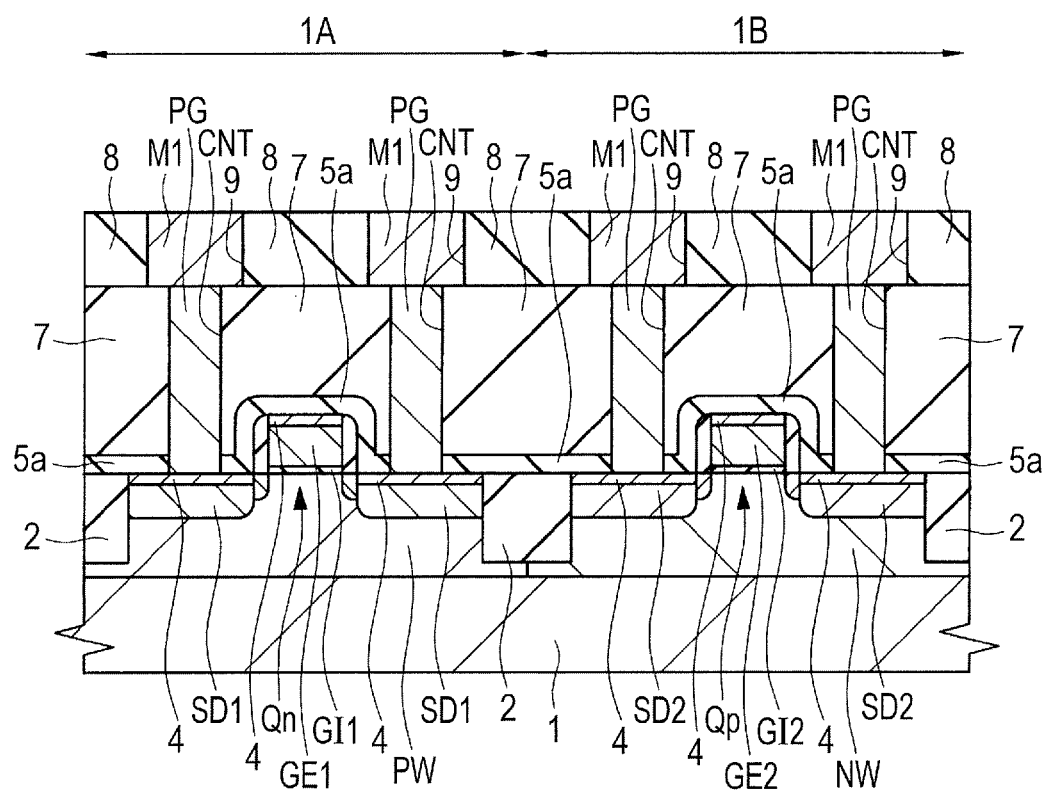
FIG. 33 is a cross-sectional view of a main part of another manufacturing step of the semiconductor device, following the step shown in FIG. 32.

That is, after forming the interlayer insulating film 7, the upper surface of the interlayer insulating film 7 is planarized by polishing the surface of the interlayer insulating film 7 by the CMP method. Then, the interlayer insulating film 7 and the silicon nitride film 5a are dry-etched using a photoresist pattern (not shown) formed over the interlayer insulating film 7 as an etching mask, so that the contact holes CNT are formed in the interlayer insulating film 7 and the silicon nitride film 5a as shown in FIG. 33.

In order to form the contact holes CNT, the interlayer insulating film 7 is dry-etched using the silicon nitride film 5a as an etching stopper film on the conditions in which the interlayer insulating film 7 is etched more than the silicon nitride film 5a to thereby form the contact holes CNT in the interlayer insulating film 7. Then, the silicon nitride film 5a at the bottom of the contact hole CNT is removed by dry etching on the other conditions in which the silicon nitride film 5a is etched more than the interlayer insulating film 7 to thereby form the complete contact holes CNT as the through hole. It will be understood, however, that the contact holes CNT in the nMIS formation region 1A pass through silicon nitride film 5a whose compressive stress differs from (and in particular, is less than) the tensile stress of contact holes CNT passing through silicon nitride film 5a in the pMIS formation region 1B.

The metal silicide layer 4 over the $n^+$-type semiconductor region SD1 is exposed at the bottom of the contact hole CNT formed over the $n^+$-type semiconductor region SD1. Further, the metal silicide layer 4 over the $p^+$-type semiconductor region SD2 is exposed at the bottom of the contact hole CNT formed over the $p^+$-type semiconductor region SD2. The silicon nitride film 5a serves as the etching stopper film upon forming the contact holes CNT, which can suppress or prevent the excessive digging of the contact hole CNT or the damage on the substrate.

The following steps after the formation step of the contact hole CNT are basically the same as those described in the first embodiment with reference to FIGS. 14 and 15. That is, as shown in FIG. 33, a conductive plug PG is formed in each contact hole CNT. The insulating film for formation of wiring (interlayer insulating film) 8 is formed over the interlayer insulating film 7 with the plugs PG embedded therein. The wiring trench 9 is formed in the insulating film 8. Then, the wiring M1 is formed in the wiring trench 9.

Next, the main features of this embodiment will be described below.

In this embodiment, the silicon nitride film 5a common to both the nMIS formation region 1A and the pMIS formation region 1B is formed. Like the first comparative example shown in FIGS. 16 and 17, there is no part where the stress film for the n-channel MISFETQn is superimposed on the stress film for the p-channel MISFETQp, which can prevent the film peeling and the generation of foreign matter due to the presence of the superimposed part, and thus can improve the manufacturing yield. The silicon nitride film 5a common to both the nMIS formation region 1A and the pMIS formation region 1B can serve as an etching stopper film when forming the contact hole CNT in the nMIS formation region 1A and the contact hole CNT in the pMIS formation region 1B, which can suppress or prevent the excessive digging of the contact hole CNT or the damage on the substrate.

In this embodiment, the silicon nitride film 5a is formed over both the nMIS formation region 1A and the pMIS formation region 1B. The compressive stress of the silicon nitride film 5a in the pMIS formation region 1B is larger than that of the silicon nitride film 5a in the nMIS formation region 1A. That is, the compressive stress of the silicon nitride film 5a covering the p-channel MISFETQp is more than that of the silicon nitride film 5a covering the n-channel MISFETQn. In other words, the compressive stress of the silicon nitride film 5a in the nMIS formation region 1A is smaller than that the tensile stress of the silicon nitride film 5a in the pMIS formation region 1B. That is, the compressive stress of the silicon nitride film 5a covering the n-channel MISFETQn is smaller than that of the silicon nitride film 5 covering the p-channel MISFETQp. This state (magnitude relationship about the compressive stress) is established by the plasma processing in step S6a, and is also maintained after the plasma processing in step S6a, that is, also in the semiconductor device manufactured.

Thus, the silicon nitride film 5a applies the large compressive stress to the p-channel MISFETQp (channel region thereof) in the pMIS formation region 1B, which can surely improve the characteristics (on-state current) of the p-channel MISFETQp characteristics. In contrast, the silicon nitride film 5a has decreased compressive stress acting on the n-channel MISFETQn (channel region thereof) in the nMIS formation region 1A, which can suppress or prevent the reduction in characteristics (for example, on-state current) of the n-channel MISFETQn. Accordingly, this embodiment can improve the characteristics (on-state current) of the p-channel MISFETQp, while suppressing or preventing the reduction of the characteristics (for example, on-state current) of the n-channel MISFETQn. This arrangement can improve the performance of the semiconductor device with the CMISFET. From this viewpoint, the compressive stress of the silicon nitride film 5a in the pMIS formation region 1B is more preferably at least twice as large as the compressive stress of the silicon nitride film 5a in the nMIS formation region 1A (that is, the compressive stress of the silicon nitride film 5a covering the p-channel MISFETQp is at least twice as large as the compressive stress of the silicon nitride film 5a covering the n-channel MISFETQn). The absolute value (absolute value of the stress) of the compressive stress of the silicon nitride film 5a in the pMIS formation region 1B is preferably 2 GPa or more.

As can be seen from the comparison between the parts "A" and "B" shown in FIG. 18, and the parts "C" and "D" shown in FIG. 18, the tensile stress film has the more effect of relieving (decreasing) the stress by the plasma processing than that of the compressive stress film. Thus, the difference in tensile stress between the silicon nitride film 5 in the nMIS formation region 1A and the silicon nitride film 5 in the pMIS formation region 1B in the first embodiment tends to be more than that in compressive stress between the silicon nitride film 5a in the nMIS formation region 1A and the silicon nitride film 5a in the pMIS formation region 1B in the second embodiment. The above first embodiment is more advantageous from this point.

Then, modified examples of the second embodiment will be described below.

Figure 34:
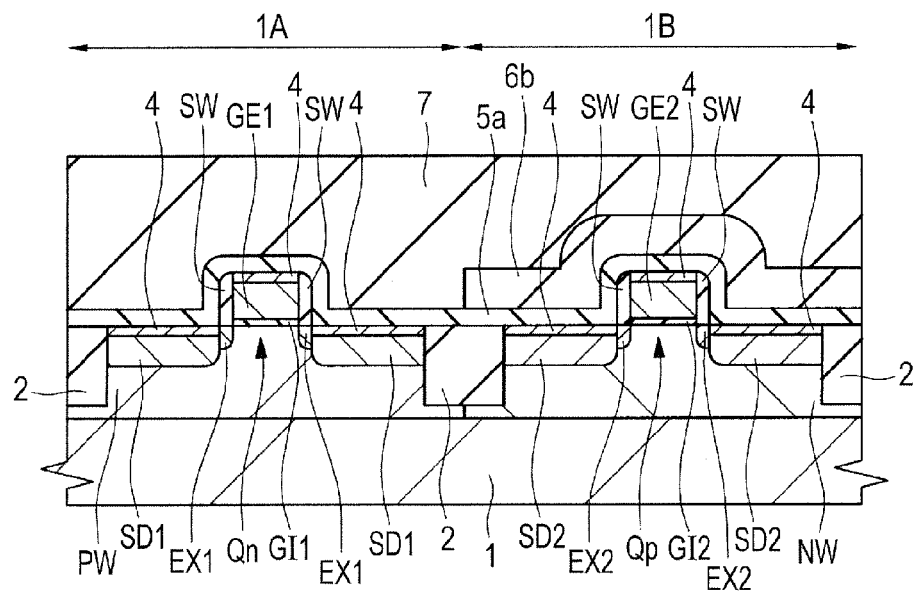
FIG. 34 is a cross-sectional view of a main part of a manufacturing step of a semiconductor device in a modified embodiment of another embodiment of the invention.
Figure 35:
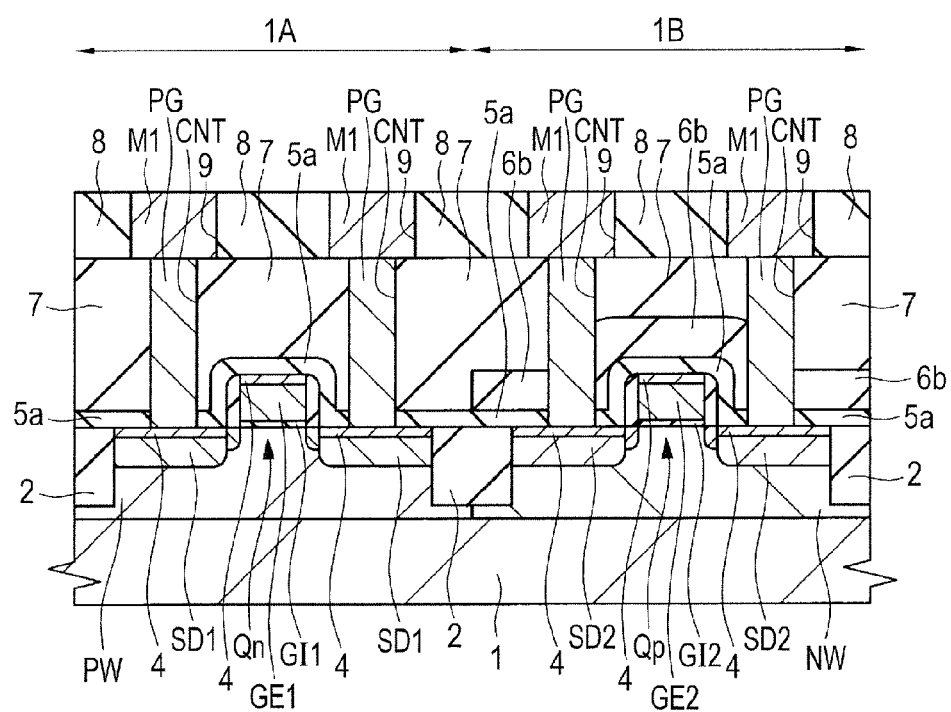
FIG. 35 is a cross-sectional view of a main part of another manufacturing step of the semiconductor device, following the step shown in FIG. 34.

In the processes shown in FIGS. 26 to 33 (second embodiment), after performing the plasma processing in step S6a, the mask layer 6b is removed in step S7a, and then the interlayer insulating film 7 is formed. In a modified example of the second embodiment, after the plasma processing in step S6a, the interlayer insulating film 7 is formed without removing the mask layer 6b in step S7a, which will be described below with reference to FIGS. 34 and 35. FIGS. 34 and 35 are cross-sectional views of main parts of manufacturing steps of a semiconductor device in the modified example of the second embodiment.

After performing the plasma processing in step S6a as shown in FIGS. 27 to 30, in the case of the modified example of the second embodiment, the interlayer insulating film 7 is formed in step S8 without removing the mask layer 6b in step S7a as shown in FIG. 34. In the case shown in FIG. 32, the interlayer insulating film 7 is formed directly over the silicon nitride film 5 in both the nMIS formation region 1A and the pMIS formation region 1B. In the modified case (modified example) of the second embodiment shown in FIG. 34, the interlayer insulating film 7 is formed with the mask layer 6b remaining (not removed) in the pMIS formation region 1B, so that the interlayer insulating film 7 is formed over the mask layer 6b in the pMIS formation region 1B, and over the silicon nitride film 5a in the nMIS formation region 1A.

After forming the interlayer insulating film 7, the upper surface of the interlayer insulating film 7 is planarized by polishing the surface of the interlayer insulating film 7 by the CMP method.

Then, the contact holes CNT are formed in the interlayer insulating film 7, the mask layer 6b, and the silicon nitride film 5a as shown in FIG. 35 by dry etching the interlayer insulating film 7, the mask layer 6b, and the silicon nitride film 5a using a photoresist pattern (not shown) formed over the interlayer insulating film 7 as an etching mask. The contact holes CNT are formed to penetrate a laminated film (laminated insulating film) comprised of the interlayer insulating film 7, the mask layer 6b, and the silicon nitride film 5a in the pMIS formation region 1B, and also to penetrate a laminated film (laminated insulating film) comprised of the interlayer insulating film 7, and the silicon nitride film 5a in the nMIS formation region 1A.

In order to form the contact hole CNT, first, the interlayer insulating film 7 and the mask layer 6b are dry-etched using the silicon nitride film 5a as an etching stopper film on the conditions in which the interlayer insulating film 7 and the mask layer 6b are etched more than the silicon nitride film 5a. The contact holes CNT are formed in the interlayer insulating film 7 in the nMIS formation region 1A and in the interlayer insulating film 7 and the mask layer 6b in the pMIS formation region 1B. Then, the part of the silicon nitride film 5a located at the bottom of the contact hole CNT is dry-etched and removed on the conditions in which the silicon nitride film 5a is etched more than the interlayer insulating film 7 and the mask layer 6b, so that the contact hole CNT is formed as a through hole. The metal silicide layer 4 over the $n^+$-type semiconductor region SD1 is exposed at the bottom of the contact hole CNT formed over the $n^+$-type semiconductor region SD1. Further, the metal silicide layer 4 over the $p^+$-type semiconductor region SD2 is exposed at the bottom of the contact hole CNT formed over the $p^+$-type semiconductor region SD2. Upon forming the contact hole CNT, the silicon nitride film 5a serves as the etching stopper film, which can suppress or prevent the excessive digging of the contact hole CNT or the damage on the substrate.

The following steps after the formation step of the contact hole CNT are basically the same as those described with reference to FIGS. 14 and 15 of the first embodiment. That is, as shown in FIG. 35, the conductive plug PG is formed in each contact hole CNT, and the insulating film (interlayer insulating film) 8 for formation of wiring is formed over the interlayer insulating film 7 with the plug PG embedded therein. Each wiring trench 9 is formed in the insulating film 8, and the wiring M1 is formed in the wiring trench 9.

In the modified example shown in FIGS. 34 and 35, the mask layer 6b also remains in the manufactured semiconductor device because the removal process of the mask layer 6b in step S7a is not performed. The mask layer 6b needs to have insulating properties, and thus the mask layer 6b and the material film 6 included in the mask layer 6a are insulating films. In order to easily form the contact hole CNT, the mask layer 6b is more preferably made of the same material as that of the interlayer insulating film 7. Thus, a silicon oxide film can be suitably used as the mask layer 6b (namely, the material film 6).

When the mask layer 6b is formed of a silicon nitride film as described in the first embodiment, the mask layer 6b made of the silicon nitride film is subjected to the plasma processing in step S6a to become a tensile stress film. From the viewpoint of increasing the compressive stress acting on the channel region of the p-channel MISFETQp as much as possible, the steps shown in FIGS. 27 to 33 (in the case of removing the mask layer 6b) is more preferable than in the modified examples shown in FIGS. 34 and 35 (in the case of leaving the mask layer 6b).

The invention made by the inventors has been specifically described based on the preferred embodiments. It is apparent that the invention is not limited to the above embodiments, and that various variations and changes can be made to the disclosed embodiments without departing from the scope of the invention.

The present invention is effectively applied to semiconductor devices and manufacturing techniques thereof.

What is claimed is:

1. A manufacturing method of a semiconductor device, said semiconductor device including an n-channel type first MISFET in a first region of a semiconductor substrate, a p-channel type second MISFET in an adjacent second region of the semiconductor substrate, and a silicon nitride film covering the first and second MISFETs and having a different tensile stress in the adjacent first and second regions, said manufacturing method comprising the steps of:

(a) preparing the semiconductor substrate;
(b) respectively forming the first MISFET in the first region of the semiconductor substrate, and the second MISFET in the second region of the semiconductor substrate;
(c) after the step (b), forming a first insulating film serving as a tensile stress film and comprised of silicon nitride over the semiconductor substrate so as to cover the first and second MISFETs;
(d) after the step (c), forming a mask layer covering the first insulating film in the first region and exposing the first insulating film in the second region;
(e) after the step (d), performing plasma processing on the first insulating film in the second region; and
(f) after the step (e), forming an interlayer insulating film over the first insulating film in the first and second region,
wherein the step (c) comprises the steps of:
(c1) forming a silicon nitride film; and
(c2) after the step (c1), irradiating the silicon nitride film formed in the step (c1) with ultraviolet rays;
wherein a cycle comprised of the step (c1) and the step (c2) is repeated one or more times to thereby form the first insulating film, and
wherein in the step (e), the plasma processing relieves a tensile stress of the first insulating film in the second region.

2. The manufacturing method of a semiconductor device according to claim 1, wherein in the step (e), the plasma processing is performed with the first insulating film in the first region covered with the mask layer.

3. The manufacturing method of a semiconductor device according to claim 2, wherein after the plasma processing in the step (e), the tensile stress of the first insulating film in the second region is smaller than that of the first insulating film in the first region.

4. The manufacturing method of a semiconductor device according to claim 3, wherein in the step (c2), the silicon nitride film in the first region and the second region is irradiated with the ultraviolet rays.

5. The manufacturing method of a semiconductor device according to claim 4, wherein the tensile stress of the silicon nitride film formed in the step (c1) is increased by the ultraviolet ray irradiation process performed in the step (c2).

6. The manufacturing method of a semiconductor device according to claim 5, wherein a hydrogen content of the silicon nitride film formed in the step (c1) is decreased by the ultraviolet ray irradiation process performed in the step (c2).

7. The manufacturing method of a semiconductor device according to claim 6, wherein after the plasma processing in the step (e), the tensile stress of the first insulating film in the second region is no more than one-half that of the first insulating film in the first region.

8. The manufacturing method of a semiconductor device according to claim 7, wherein the plasma processing performed in the step (e) is hydrogen plasma processing, helium plasma processing, argon plasma processing, nitrogen plasma processing, ammonia plasma processing, or mixed gas plasma processing using two or more types thereof.

9. The manufacturing method of a semiconductor device according to claim 8, wherein the plasma processing performed in the step (e) is the hydrogen plasma processing.

10. The manufacturing method of a semiconductor device according to claim 9, wherein the step (d) comprises the steps of:
(d1) forming a material film for the mask layer over the first insulating film in the first and second regions; and (d2) after the step (d1), forming the mask layer by removing the material film in the second region to expose the first insulating film in the second region, while leaving the material film in the first region.

11. The manufacturing method of a semiconductor device according to claim 10, wherein in the step (c1), the silicon nitride film is formed by a plasma CVD method.

12. The manufacturing method of a semiconductor device according to claim 11, wherein the step (b) comprises the steps of:
   (b1) forming a first gate electrode over the semiconductor substrate in the first region and a second gate electrode over the semiconductor substrate in the second region via respective gate insulating films; and
   (b2) respectively forming a first semiconductor region serving as a source or drain of the first MISFET at the semiconductor substrate in the first region, and a second semiconductor region serving as a source or drain of the second MISFET at the semiconductor substrate in the second region, and
   wherein in the step (c), the first insulating film is formed over the semiconductor substrate so as to cover the first and second gate electrodes and the first and second semiconductor regions.

13. The manufacturing method of a semiconductor device according to claim 12, wherein the mask layer is comprised of a silicon oxide film.

14. The manufacturing method of a semiconductor device according to claim 13, further comprising the step of (e1) after the step (e) and before the step (f), removing the mask layer.

15. The manufacturing method of a semiconductor device according to claim 14, further comprising the step of (g) after the step (f), forming a contact hole in the interlayer insulating film and the first insulating film.

16. The manufacturing method of a semiconductor device according to claim 13, wherein in the step (f), the interlayer insulating film is formed over the mask layer in the first region, and the interlayer insulating film is formed over the first insulating film in the second region.

17. A method of manufacturing a semiconductor device having a silicon nitride film with a different tensile stress or a different compressive stress in adjacent regions thereof, comprising:
   (a) providing a semiconductor substrate having an n-channel type first MISFET in a first region of a semiconductor substrate, and a p-channel type second MISFET in an adjacent second region of the semiconductor substrate;
   (b) forming a silicon nitride film over both the first region and the second region, the silicon nitride film covering at least the first and second MISFETs;
   (c) subjecting the silicon nitride film in only one of the first and second regions to a plasma process to thereby change a tensile stress or a compressive stress of the silicon nitride film only in said one region;
   (d) after subjecting the silicon nitride film in only one of the first and second regions to a plasma process, covering both regions with an interlayer insulating film; and
   (e) after covering both regions with the interlayer insulating film, forming contact holes in both regions, the contact holes in the first region passing through silicon nitride film whose tensile or compressive stress differs from the tensile or compressive stress of contact holes passing through silicon nitride film in the second region; and
   (f) connecting a wiring layer to one or more gates, sources and drains of the first and second MISFETS through the contact holes.

18. The manufacturing method of a semiconductor device according to claim 17, comprising:
   before step (c), irradiating the silicon nitride film in both the first and second regions with ultraviolet rays to thereby increase a tensile stress thereof, and wherein:
   in step (c), subjecting only the second region to the plasma process such that a tensile stress of the silicon nitride film in the first region is at least twice as large as the tensile stress of the silicon nitride film in the second region.

19. The manufacturing method of a semiconductor device according to claim 18, comprising:
   before step (c), repeating the following more than once:
      (i) forming a silicon nitride film over both the first and second regions; and
      (ii) irradiating the formed silicon nitride film with ultraviolet rays.

20. The manufacturing method of a semiconductor device according to claim 17, comprising:
   in step (c), subjecting the silicon nitride film in only the first region to a plasma process such that a compressive stress of the silicon nitride film in the second region is at least twice as large as the compressive stress of the silicon nitride film in the first region; wherein the first region is subjected to the plasma process without first irradiating the silicon nitride film in either the first or second regions with ultraviolet rays.

21. The manufacturing method of a semiconductor device according to claim 17, comprising:
   in step (c), forming a mask over one of the first and second regions prior to subjecting the other of the first and second regions to the plasma process; and
   in step (d), covering both regions with an interlayer insulating film without first removing the mask formed over said one of the first and second regions.

22. The manufacturing method of a semiconductor device according to claim 17, comprising:
   in step (e), etching the interlayer insulating film with the silicon nitride film serving as an etching stopper film.

* * * * *